US008858835B2

(12) United States Patent
Okada et al.

(10) Patent No.: US 8,858,835 B2
(45) Date of Patent: *Oct. 14, 2014

(54) RED LIGHT-EMITTING FLOURESCENT SUBSTANCE AND LIGHT-EMITTING DEVICE EMPLOYING THE SAME

(75) Inventors: Aoi Okada, Tokyo (JP); Yumi Fukuda, Tokyo (JP); Naotoshi Matsuda, Chigasaki (JP); Iwao Mitsuishi, Tokyo (JP); Shinya Nunoue, Ichikawa (JP); Keiko Albessard, Yokohama (JP); Masahiro Kato, Naka-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 13/221,042

(22) Filed: Aug. 30, 2011

(65) Prior Publication Data
US 2012/0062106 A1 Mar. 15, 2012

(30) Foreign Application Priority Data

Sep. 9, 2010 (JP) ................................. 2010-201710
Aug. 26, 2011 (JP) ................................. 2011-184927

(51) Int. Cl.
C09K 11/64 (2006.01)
C09K 11/77 (2006.01)
C09K 11/08 (2006.01)
H01L 33/50 (2010.01)

(52) U.S. Cl.
CPC ........... *C09K 11/7734* (2013.01); *Y02B 20/181* (2013.01); *C09K 11/0883* (2013.01); *H01L 33/502* (2013.01)
USPC ............. 252/301.4 F; 252/301.4 R; 313/503; 257/98

(58) Field of Classification Search
USPC ......... 252/301.4 R, 301.4 F; 313/503; 257/98
See application file for complete search history.

(56) References Cited

U.S. PATENT DOCUMENTS

| 8,278,821 B2 * | 10/2012 | Ishida et al. .................. 313/506 |
| 8,310,145 B2 * | 11/2012 | Mitsuishi et al. ............. 313/503 |
| 8,414,145 B2 * | 4/2013 | Mitsuishi et al. ............. 362/231 |
| 8,414,795 B2 * | 4/2013 | Okada et al. ............ 252/301.4 F |
| 8,436,527 B2 * | 5/2013 | Mitsuishi et al. ............. 313/501 |
| 2009/0072195 A1 | 3/2009 | Fukuda et al. |
| 2009/0096361 A1 | 4/2009 | Fukuda et al. |
| 2010/0102707 A1 | 4/2010 | Fukuda et al. |
| 2011/0204769 A1 | 8/2011 | Fukuda et al. |
| 2011/0220919 A1 | 9/2011 | Okada et al. |
| 2012/0056209 A1* | 3/2012 | Mitsuishi et al. ............... 257/88 |
| 2012/0056216 A1* | 3/2012 | Mitsuishi et al. ............... 257/89 |
| 2012/0056225 A1* | 3/2012 | Mitsuishi et al. ............... 257/98 |

FOREIGN PATENT DOCUMENTS

| JP | 2006-307090 | | 11/2006 |
| JP | 2008-177592 | A | 7/2008 |
| JP | 2010-106127 | A | 5/2010 |
| JP | 2011-181831 | | 9/2011 |
| TW | 200730605 | A | 8/2007 |
| TW | 200811271 | A | 3/2008 |
| TW | 201030427 | A | 8/2010 |
| WO | WO 2006/087660 A1 | | 8/2006 |
| WO | WO 2006/087661 A1 | | 8/2006 |
| WO | WO 2006/093298 A1 | | 9/2006 |
| WO | WO 2006/132188 A1 | | 12/2006 |
| WO | WO 2008/096300 A1 | | 8/2008 |

OTHER PUBLICATIONS

Japanese Office Action issued Jul. 6, 2012, in Japan Patent Application No. 2011-184927 (with English translation).
Office Action issued Dec. 13, 2012 in Korean Patent Application No. 10-2011-0091189 with English language translation.
Combined Chinese Office Action and Search Report issued Apr. 22, 2013, in Chinese Patent Application No. 201110266293.4 with English translations.
U.S. Appl. No. 13/218,808, filed Aug. 26, 2011, Kato, et al.
U.S. Appl. No. 13/039,082, filed Mar. 2, 2011, Kato, et al.
U.S. Appl. No. 13/037,635, filed Mar. 1, 2011, Okada, et al.
U.S. Appl. No. 13/033,917, filed Feb. 24, 2011, Mitsuishi, et al.
U.S. Appl. No. 13/033,911, filed Feb. 24, 2011, Ishida, et al.
U.S. Appl. No. 13/034,137, filed Feb. 24, 2011, Mitsuishi, et al.
U.S. Appl. No. 13/033,954, filed Feb. 24, 2011, Mitsuishi, et al.
U.S. Appl. No. 13/033,960, filed Feb. 24, 2011, Mitsuishi, et al.
U.S. Appl. No. 13/034,120, filed Feb. 24, 2011, Mitsuishi, et al.
U.S. Appl. No. 13/036,410, filed Feb. 28, 2011, Matsuda, et al.
Korean Office Action Issued Mar. 28, 2013 in Patent Application No. 10-2011-0091189 (with English translation).
U.S. Appl. No. 13/601,433, filed Aug. 31, 2012, Mitsuishi, et al.
Japanese Office Action issued Oct. 2, 2012, in Patent Application No. 2011-184927 (with English-language translation).
Office Action mailed Oct. 29, 2013, in Taiwanese Patent Application No. 100132641 (with English-language translation).
U.S. Appl. No. 14/183,743, filed Feb. 19, 2014, Okada, et al.
U.S. Appl. No. 14/188,877, filed Feb. 25, 2014, Okada, et al.
U.S. Appl. No. 14/193,305, filed Feb. 28, 2014, Albessard, et al.

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

The embodiment provides a red light-emitting fluorescent substance represented by the following formula (1):

$$(M_{1-x}EC_x)_a M^1{}_b AlO_c N_d \qquad (1).$$

In the formula (1), M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\le0.25$ and $4<d<5$, respectively. This substance emits luminescence having a peak in the wavelength range of 620 to 670 nm when excited by light of 250 to 500 nm.

15 Claims, 22 Drawing Sheets

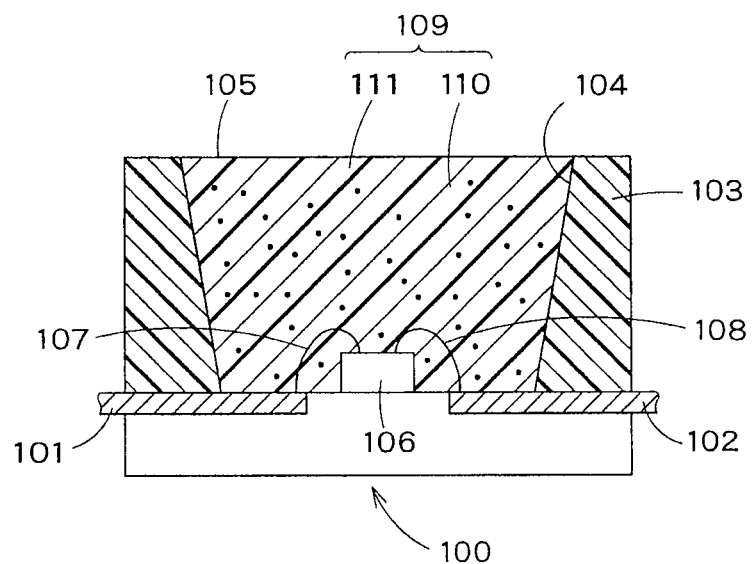
F I G. 1
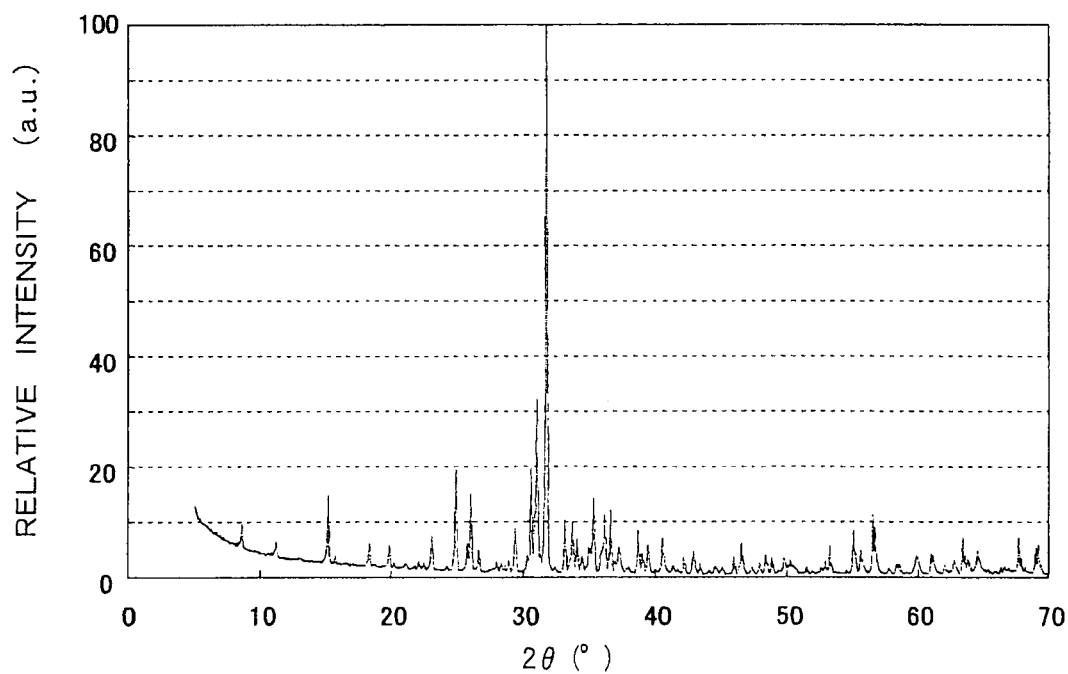
F I G. 2

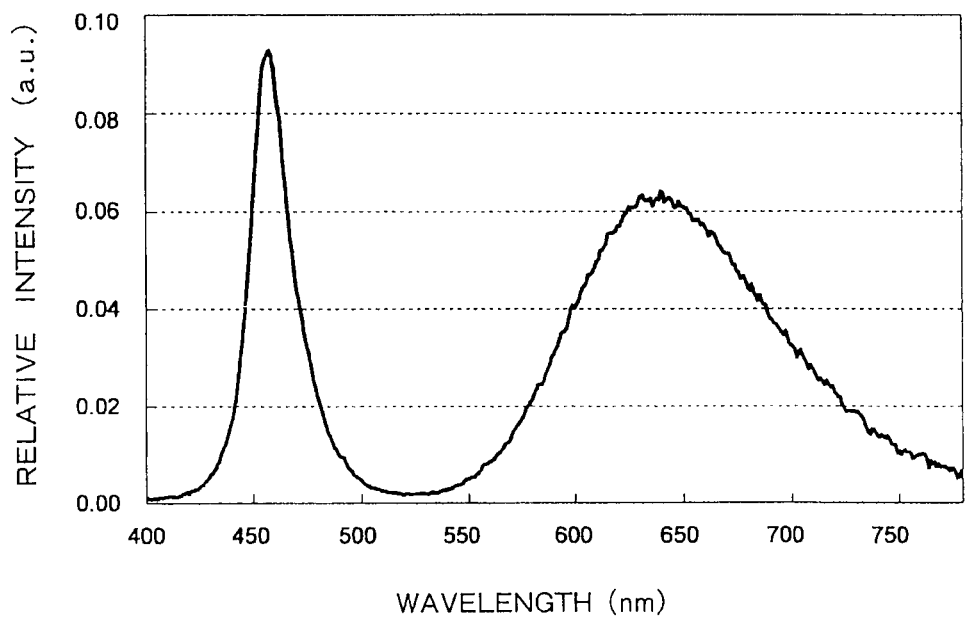
F I G. 3
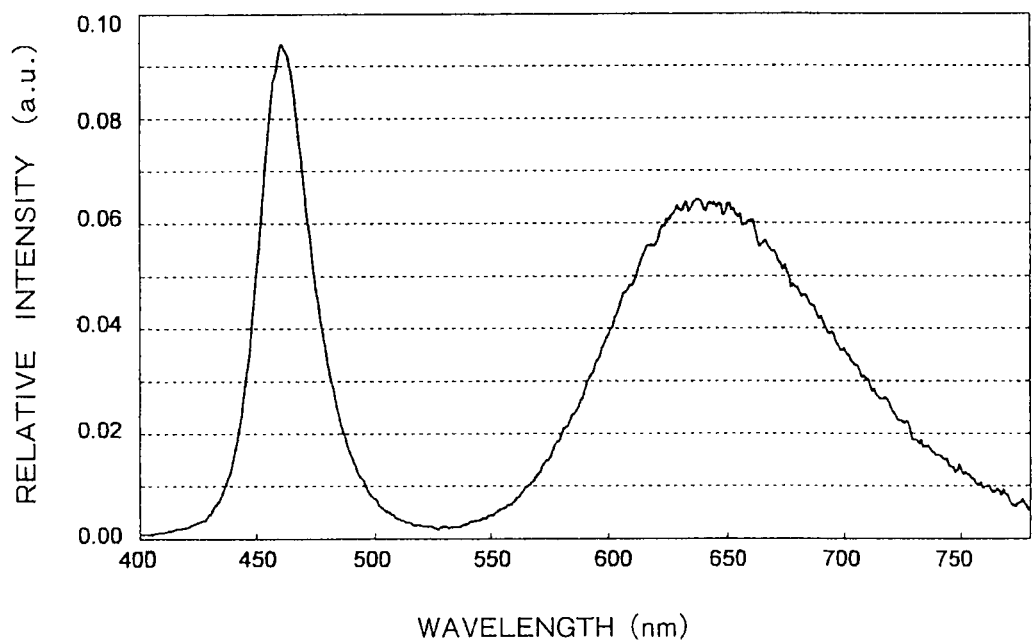
F I G. 4

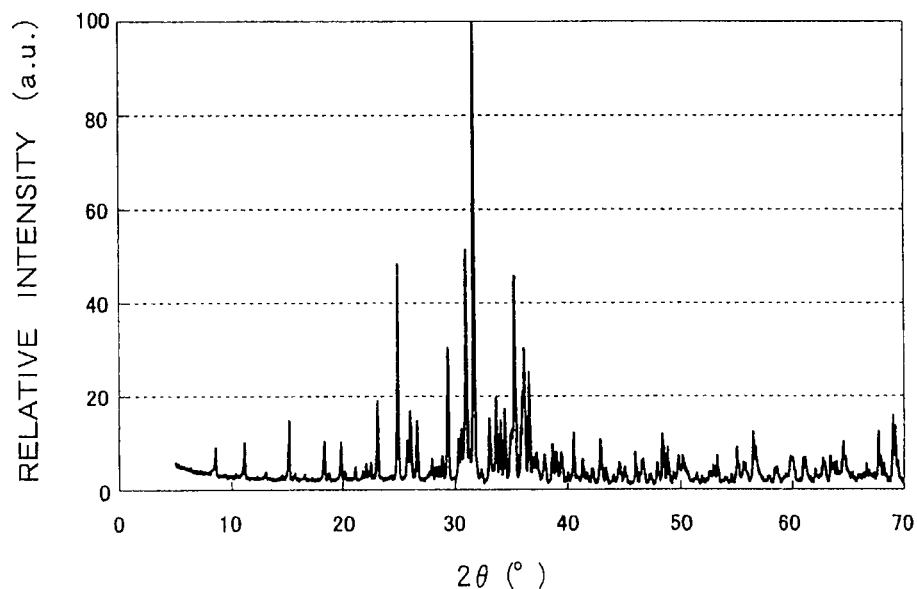
F I G. 5
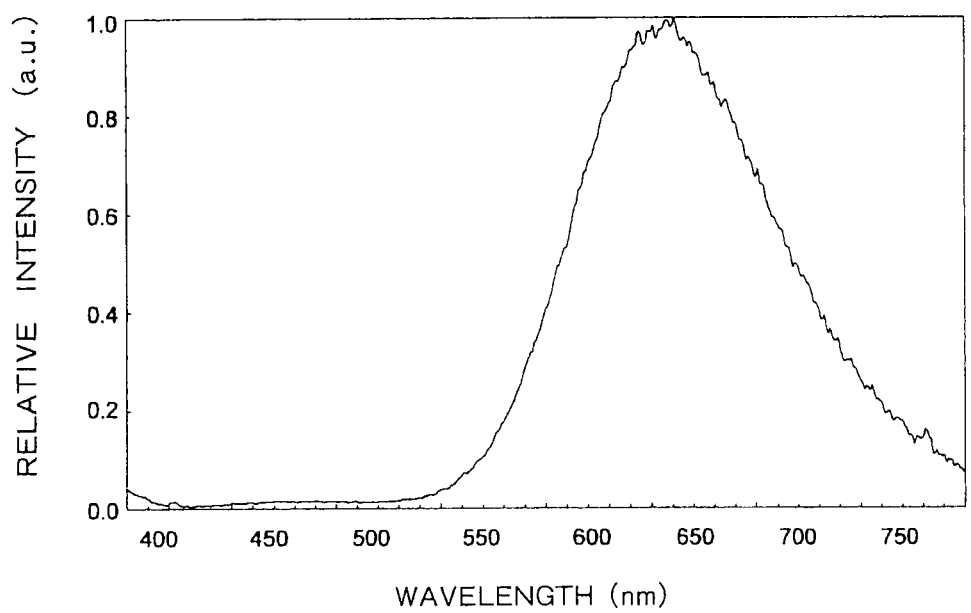
F I G. 6

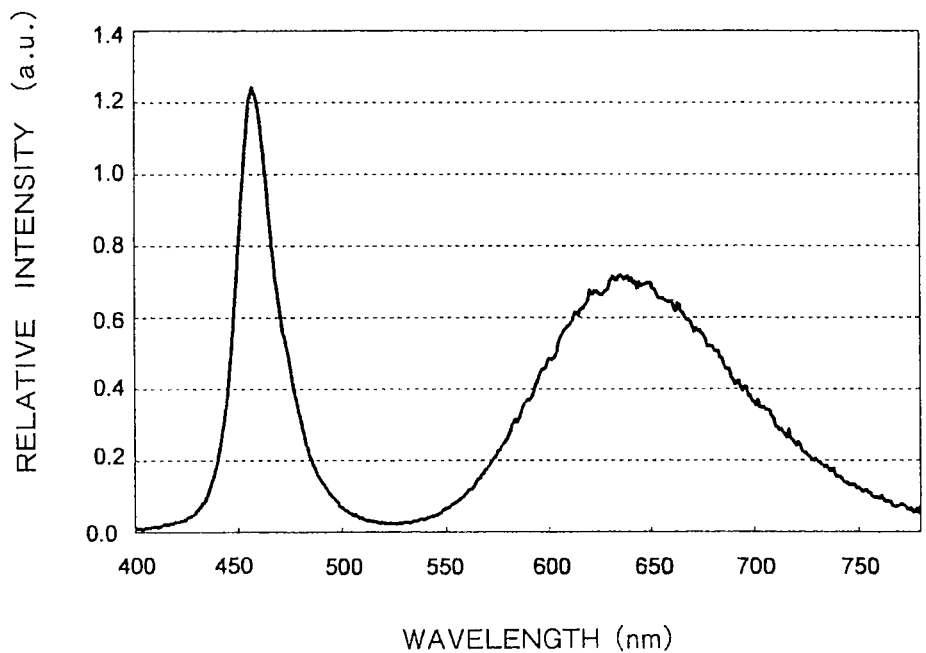
F I G. 7
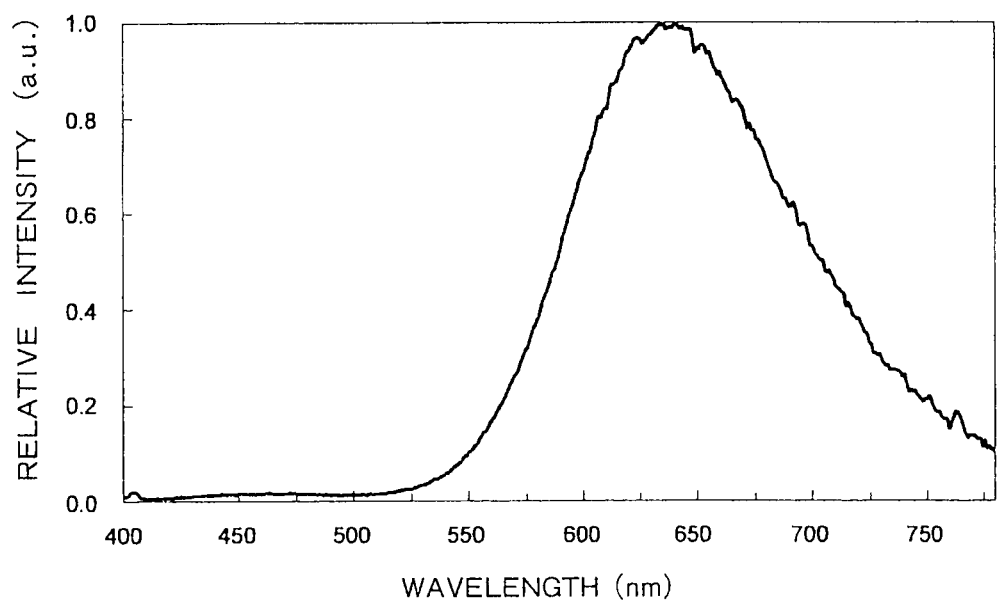
F I G. 8

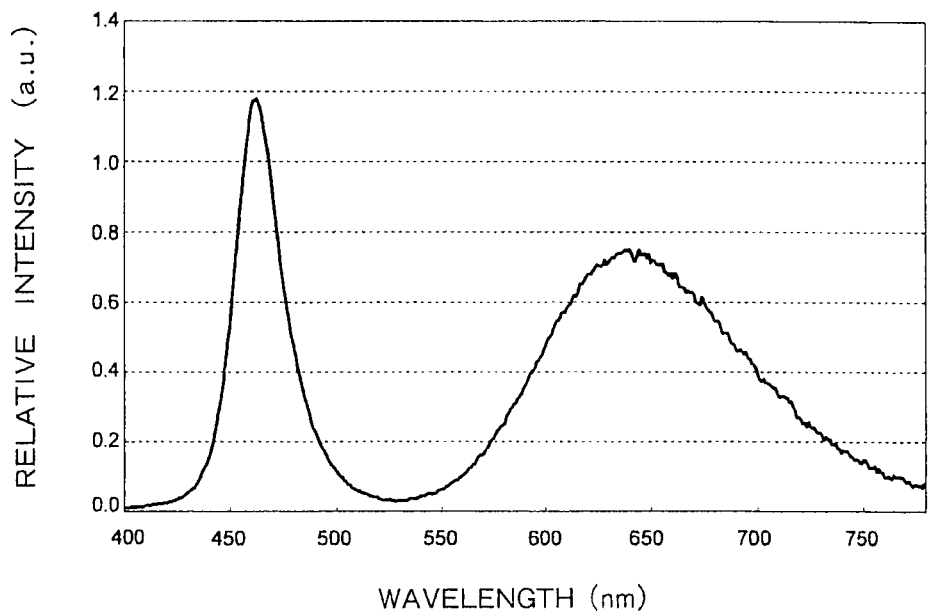
F I G. 9
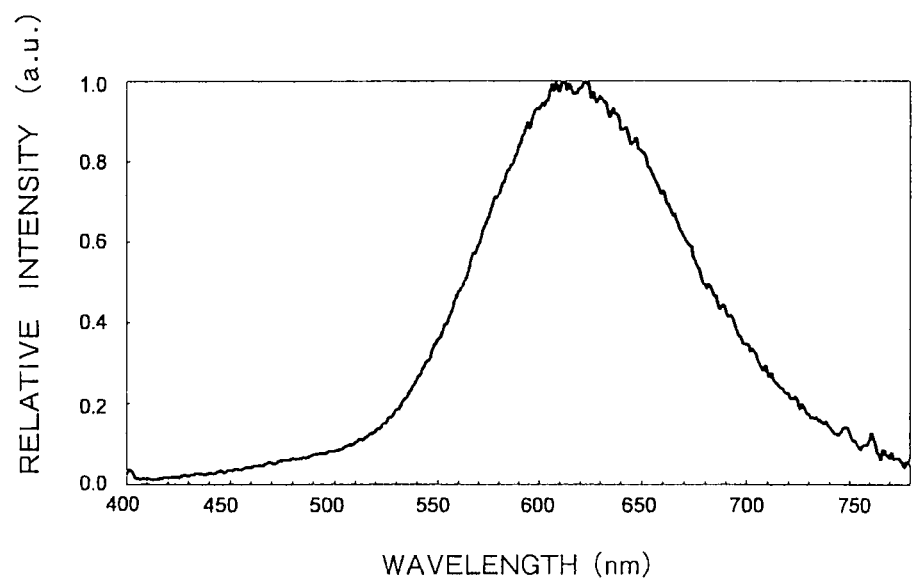
F I G. 10

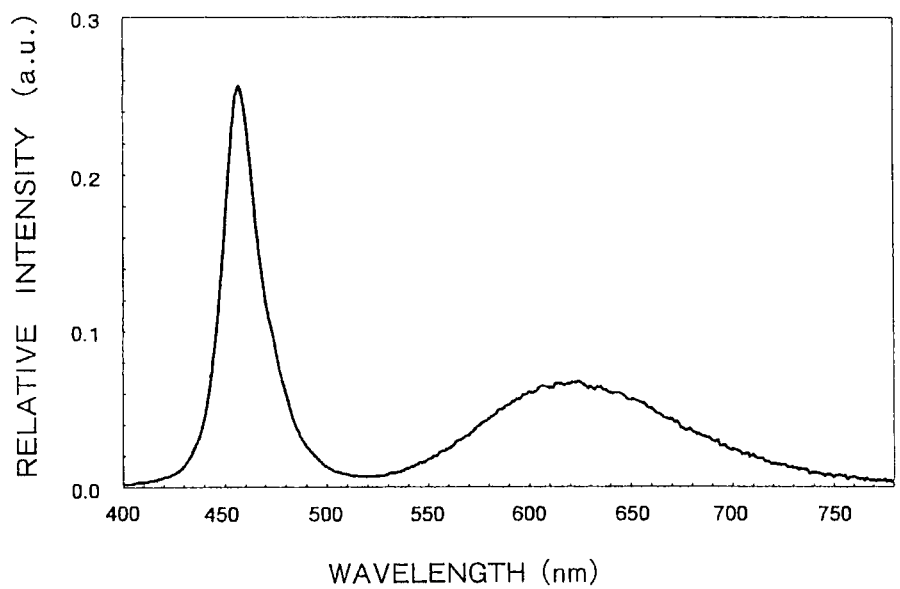
F I G. 11
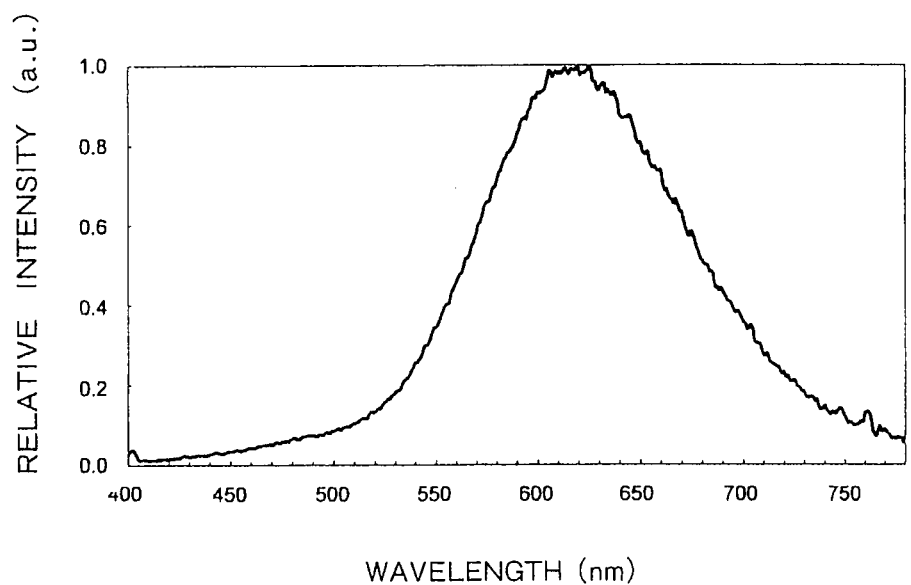
F I G. 12

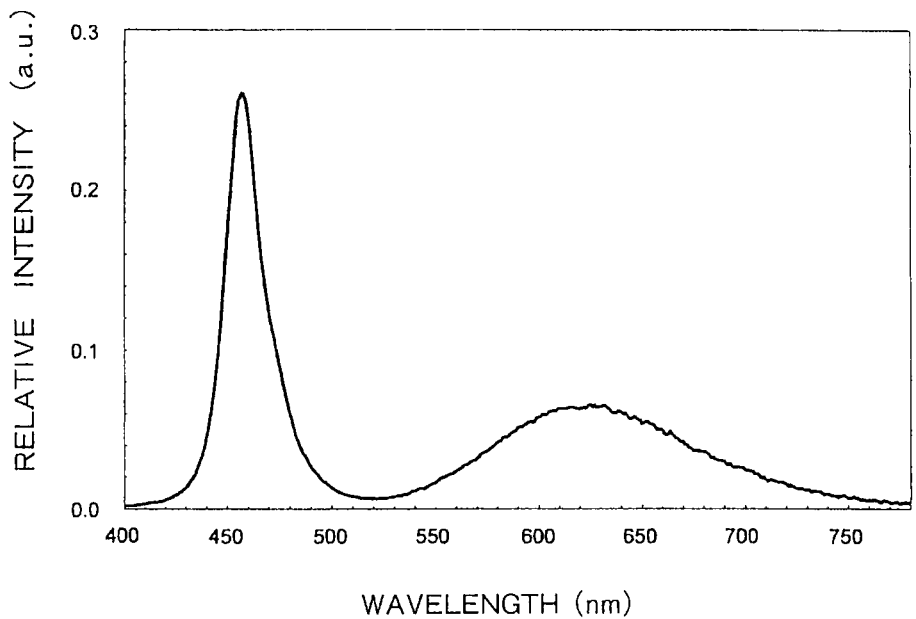
F I G. 13
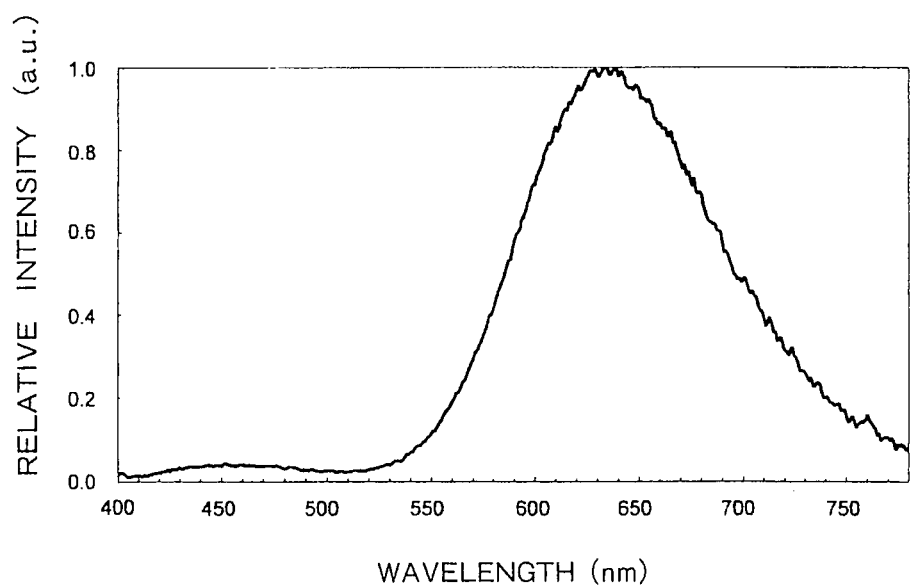
F I G. 14

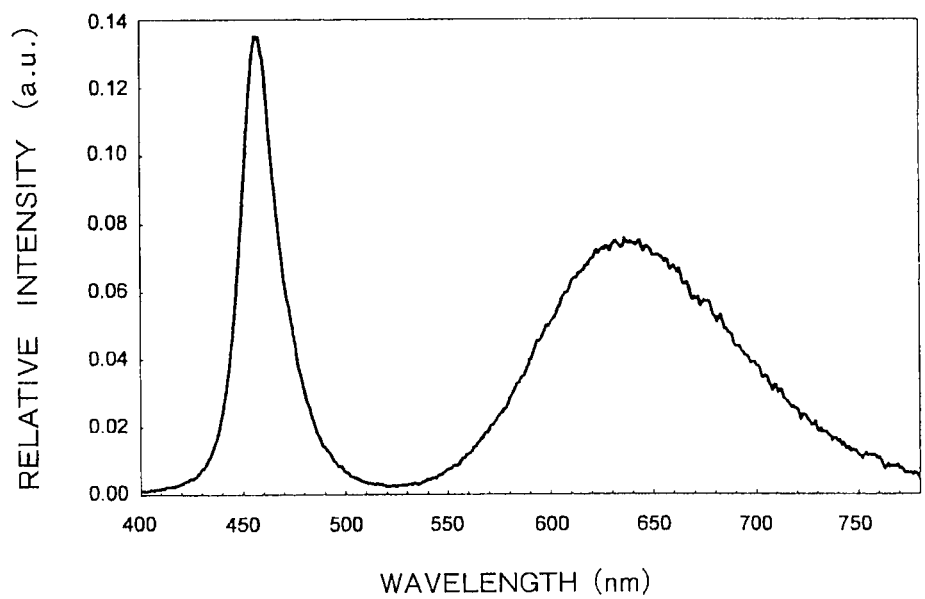
F I G. 15
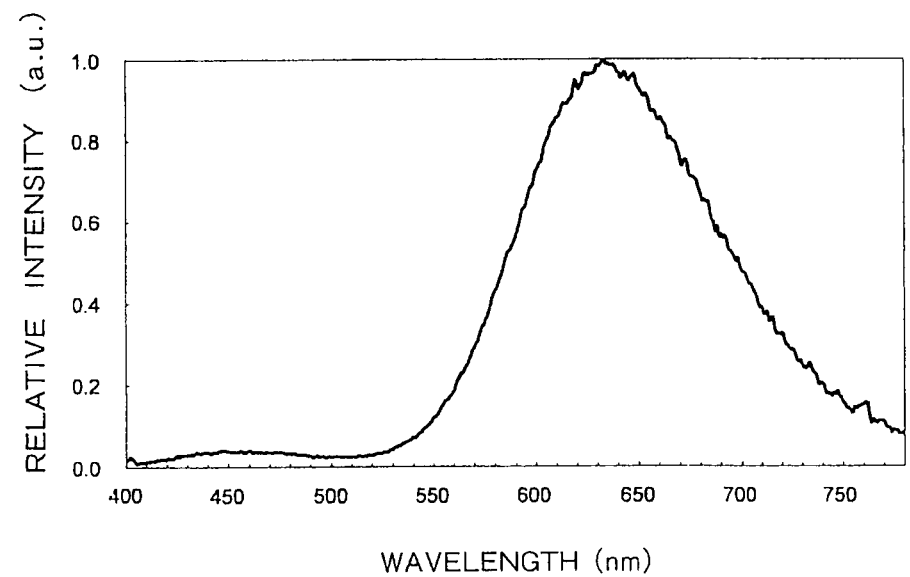
F I G. 16

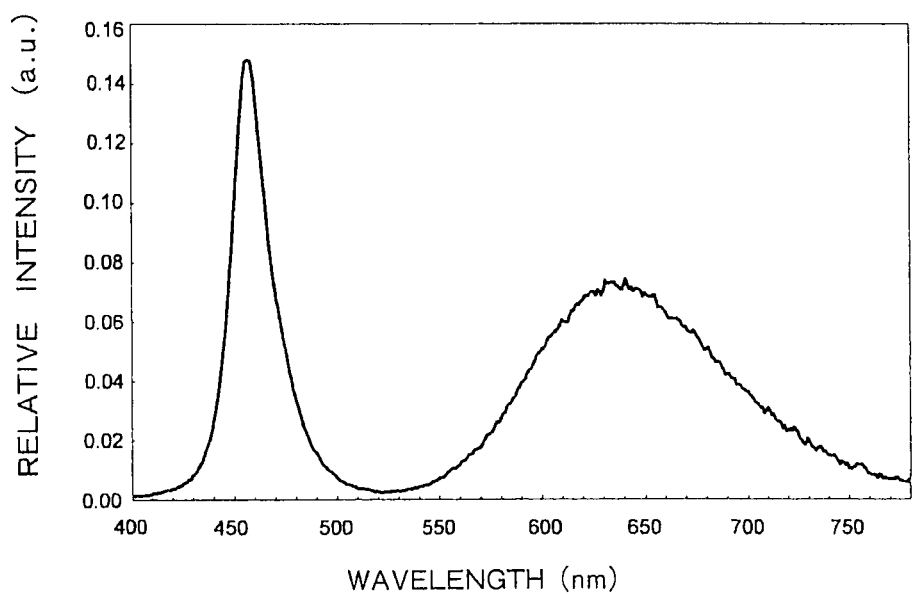
F I G. 17
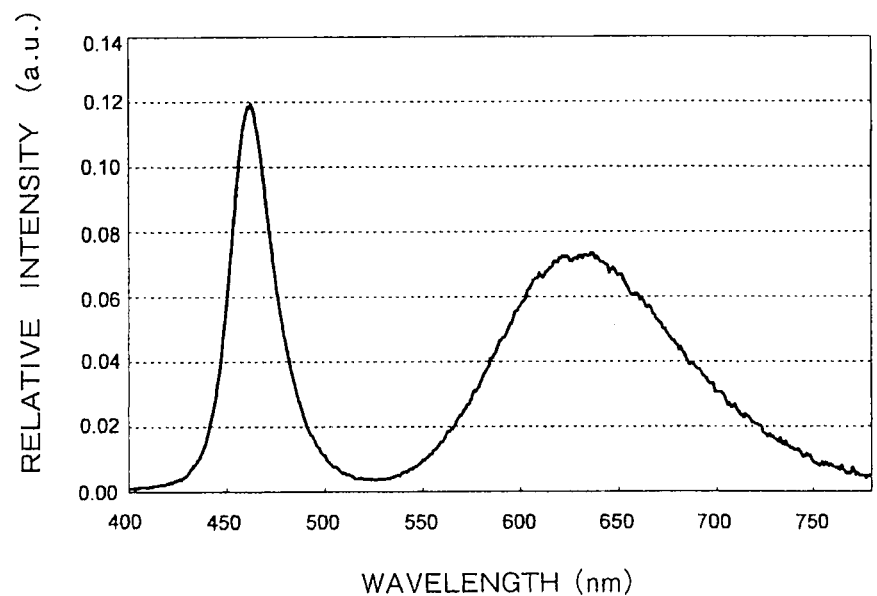
F I G. 18

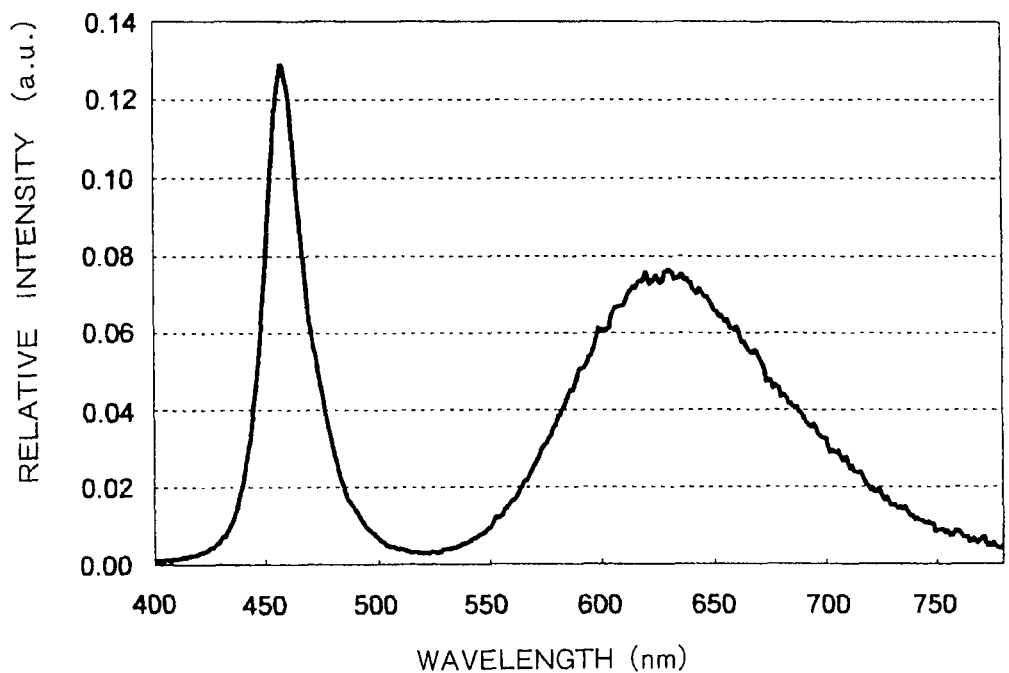
F I G. 19
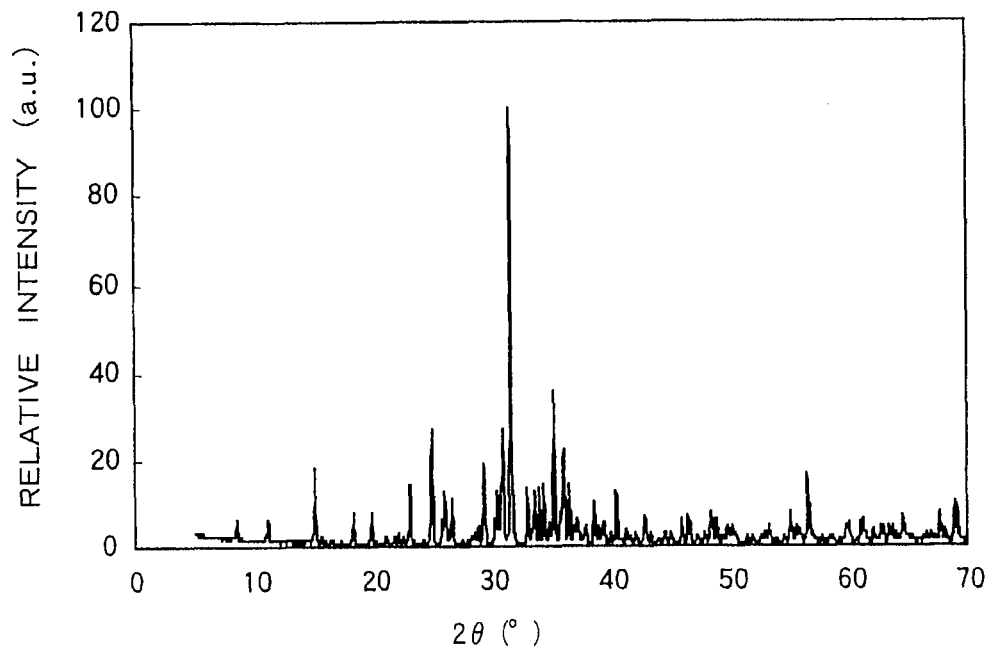
F I G. 20

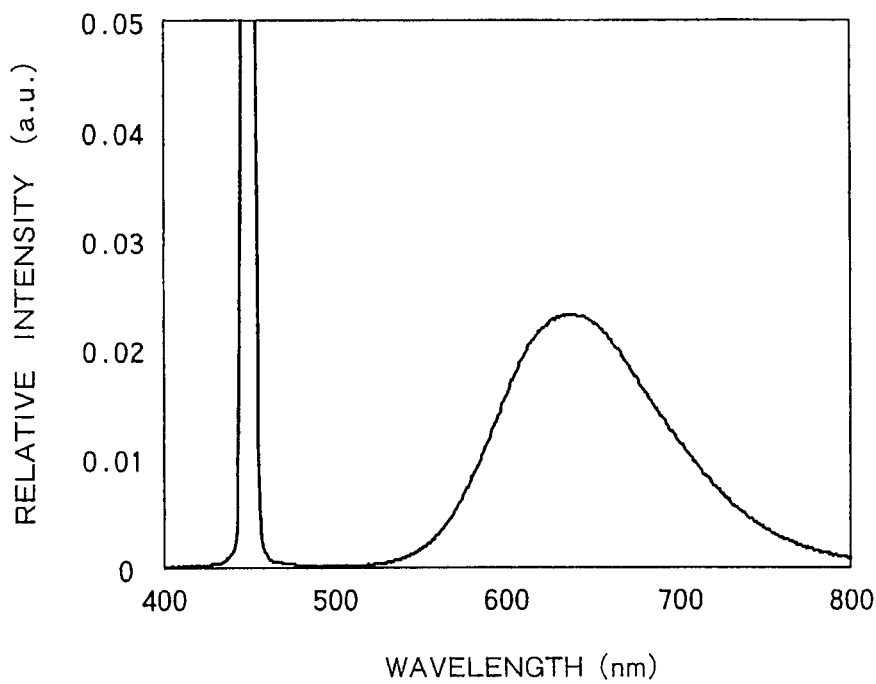
F I G. 21
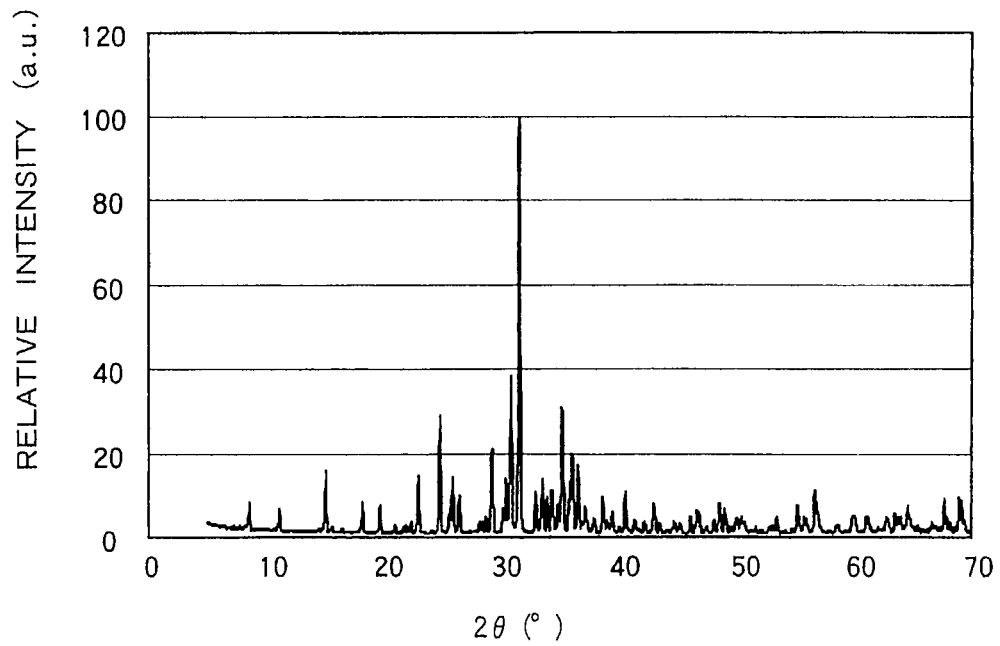
F I G. 22

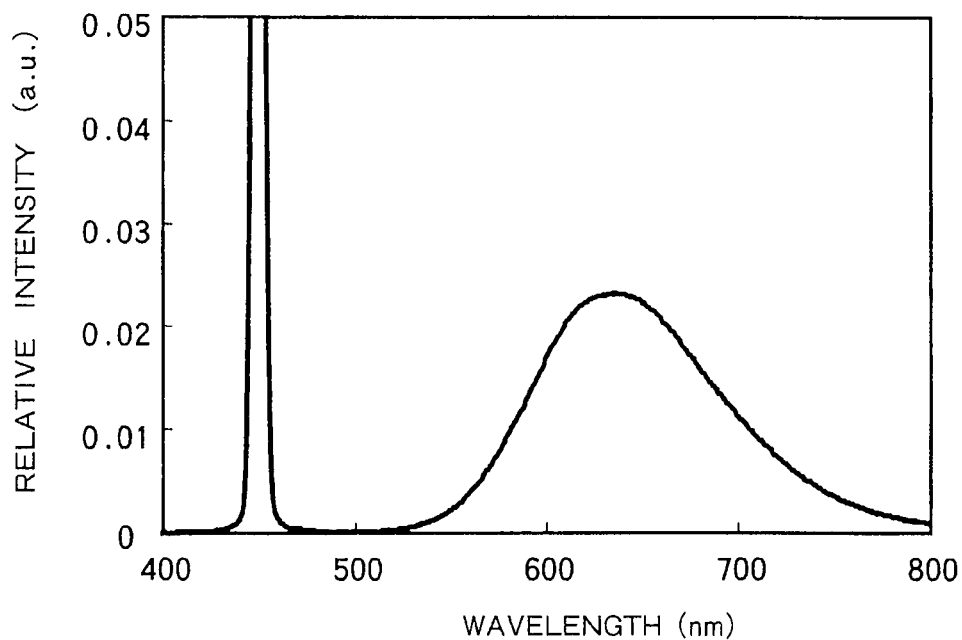
F I G. 23
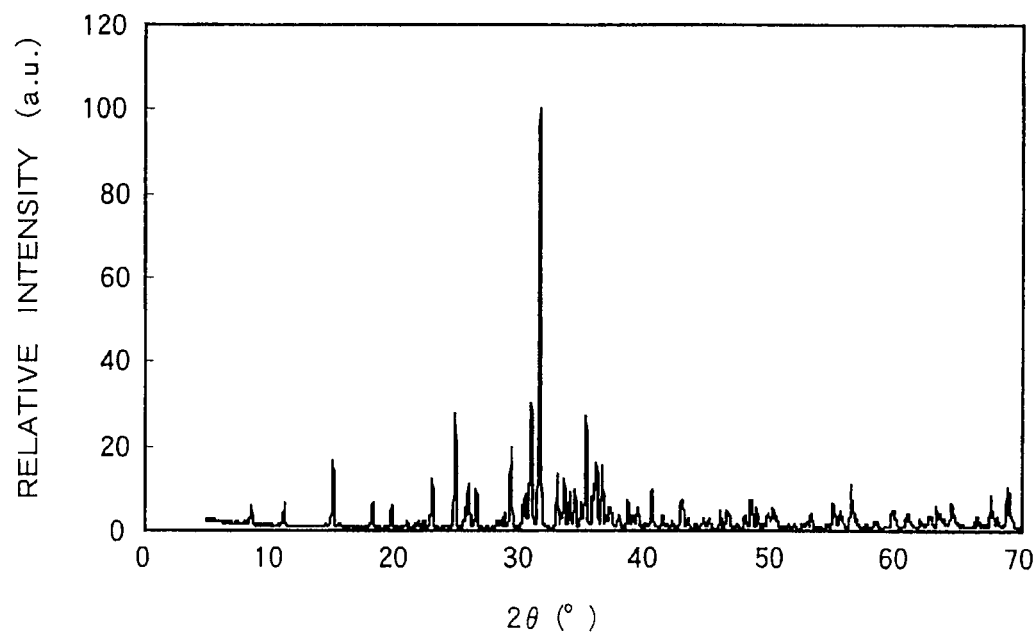
F I G. 24

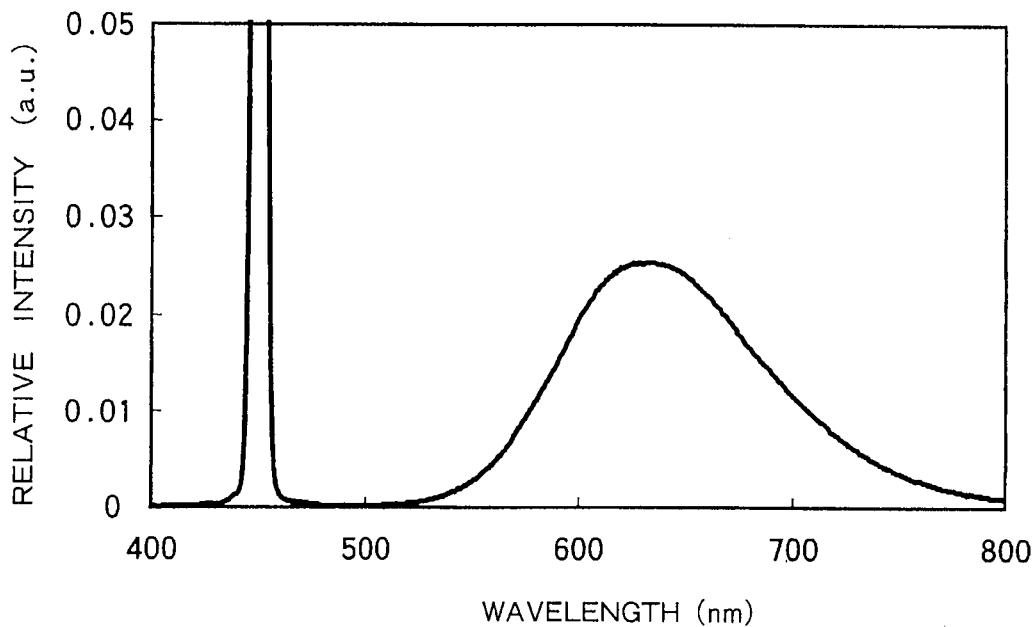
F I G. 25
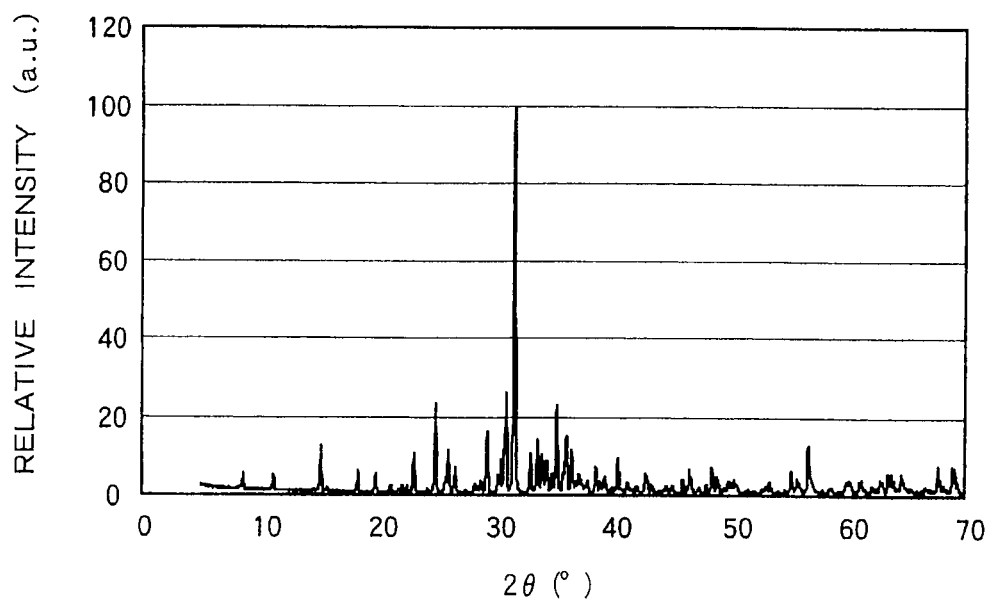
F I G. 26

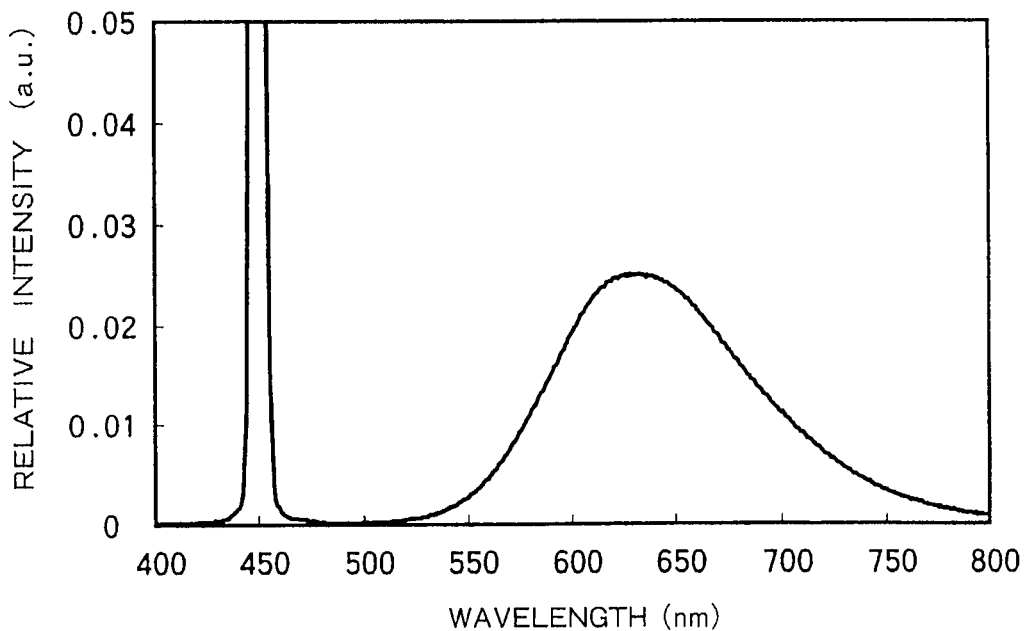
F I G. 27
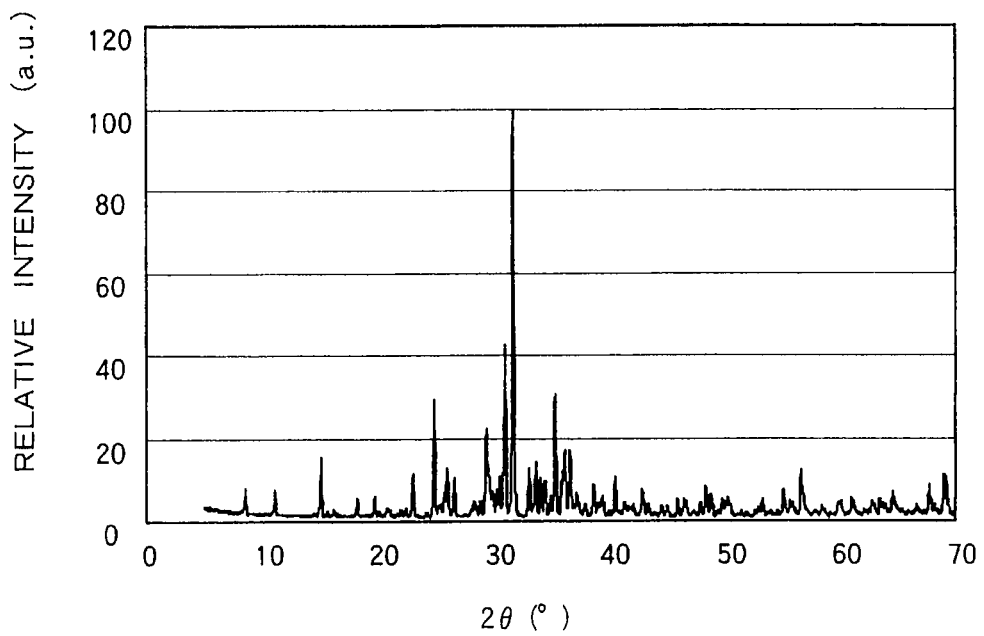
F I G. 28

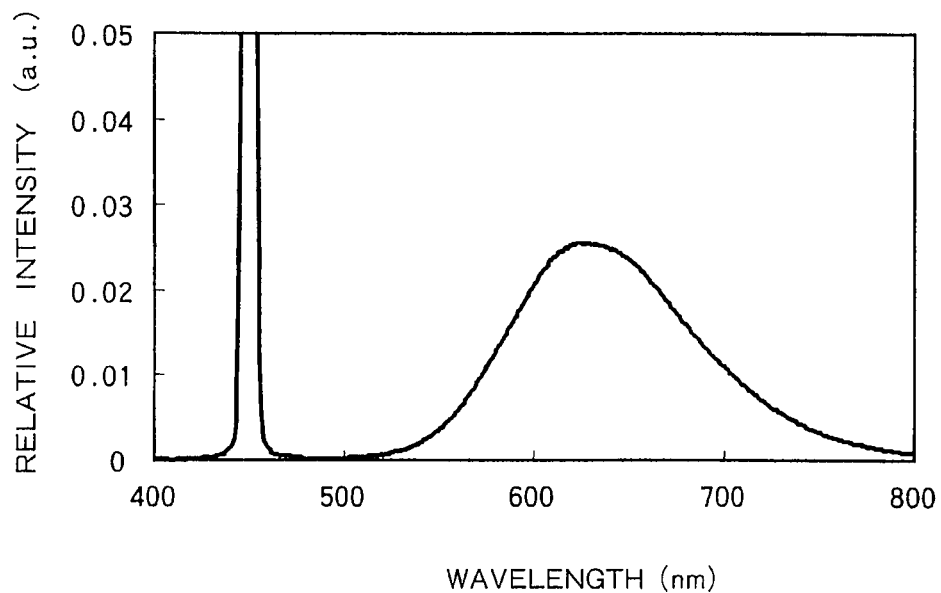
F I G. 29
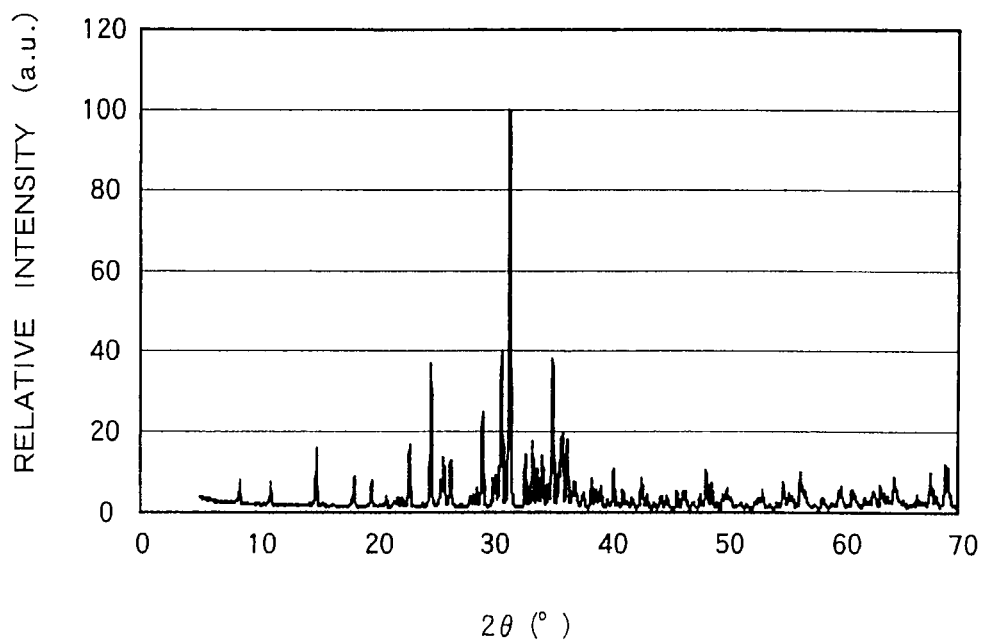
F I G. 30

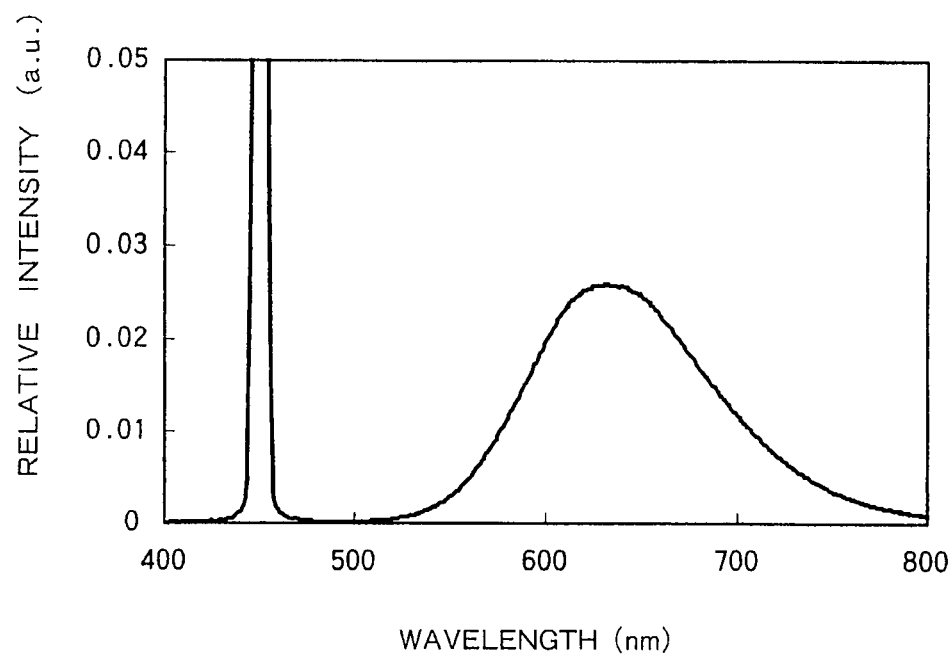
F I G. 31
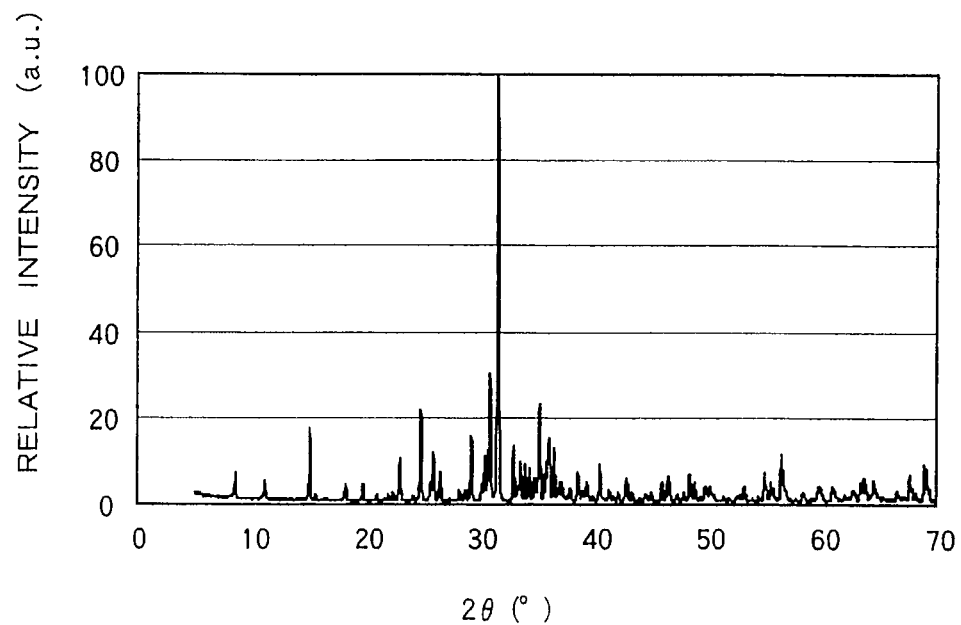
F I G. 32

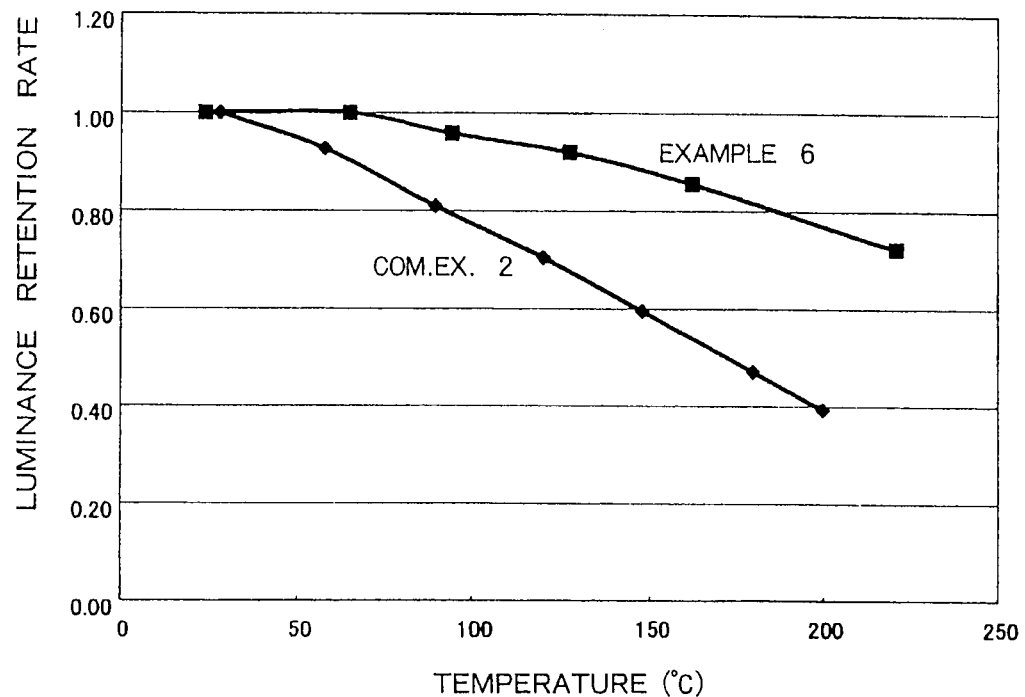
F I G. 35
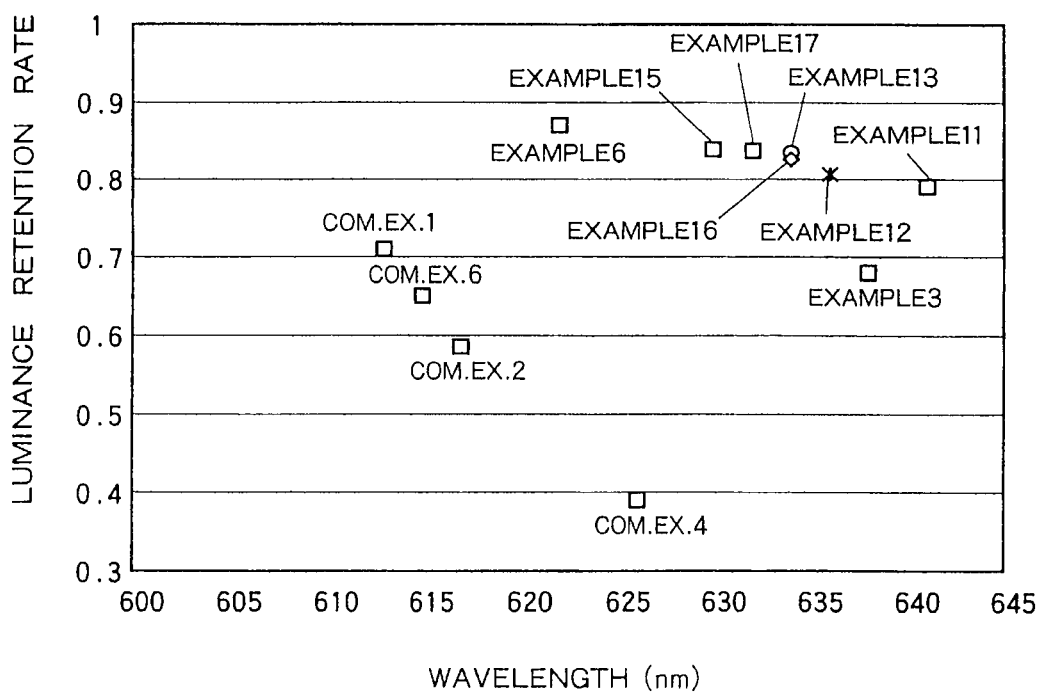
F I G. 36

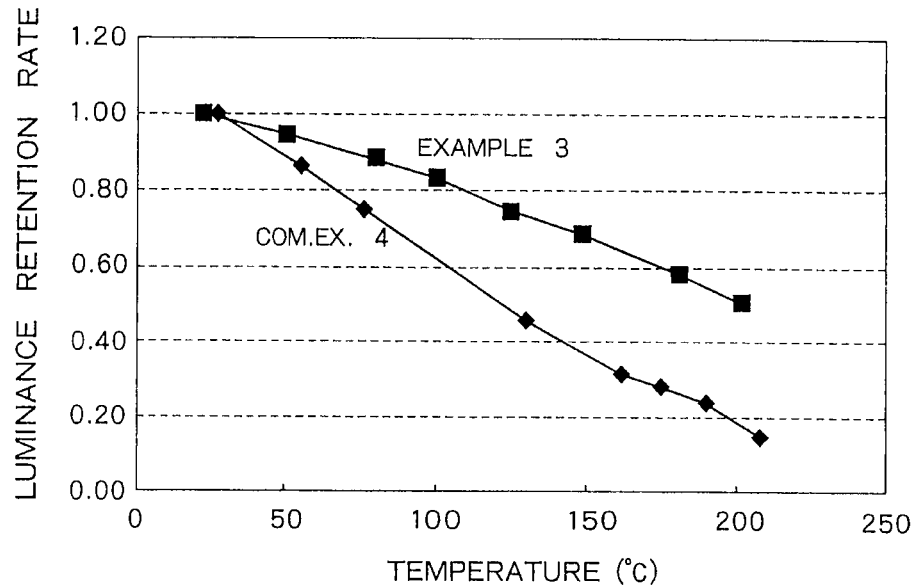
F I G. 37
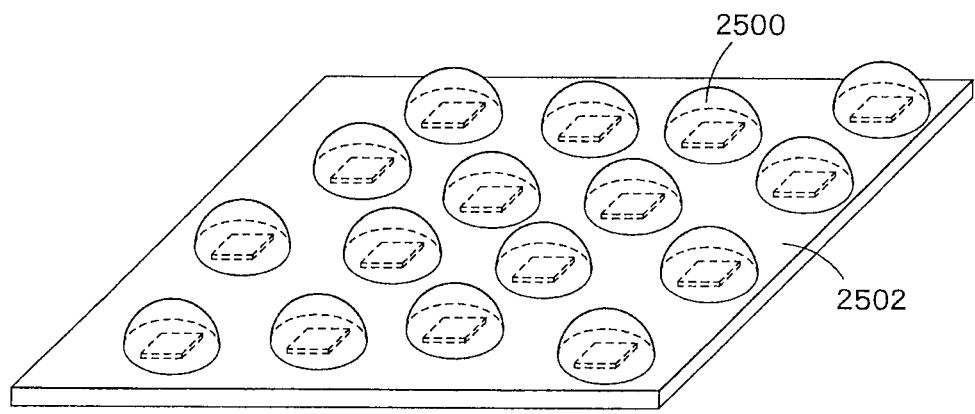
F I G. 38A
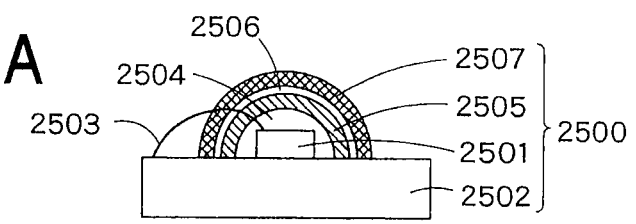
F I G. 38B

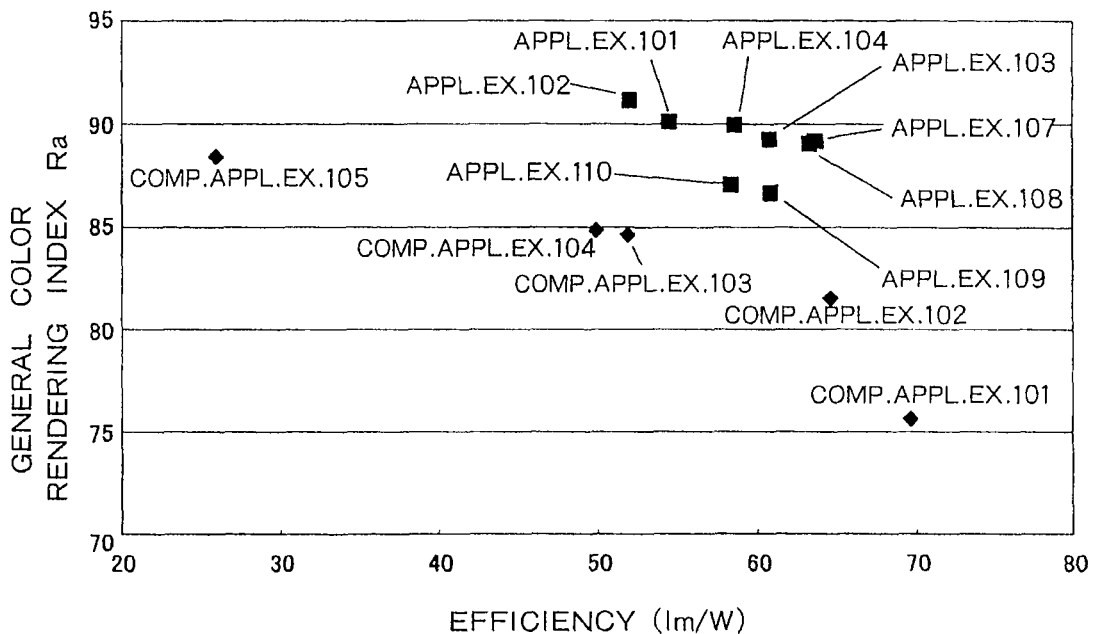
F I G. 39
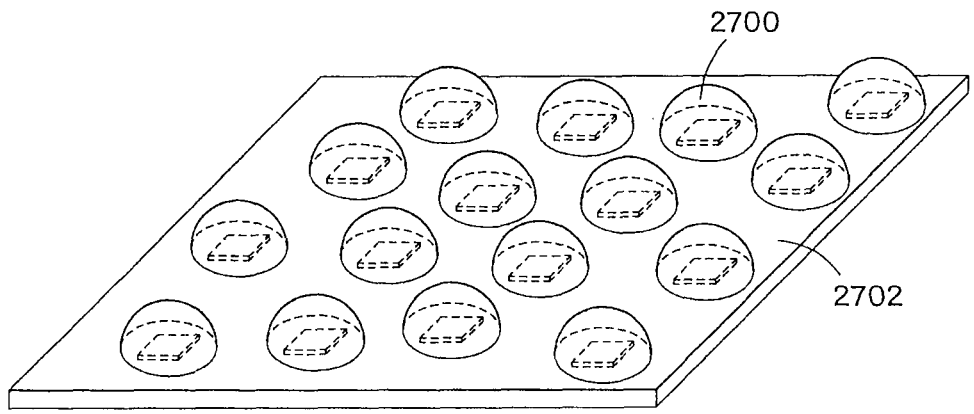
F I G. 40A
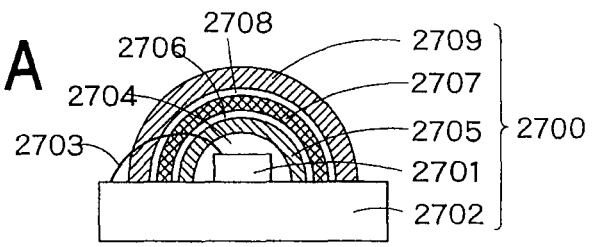
F I G. 40B

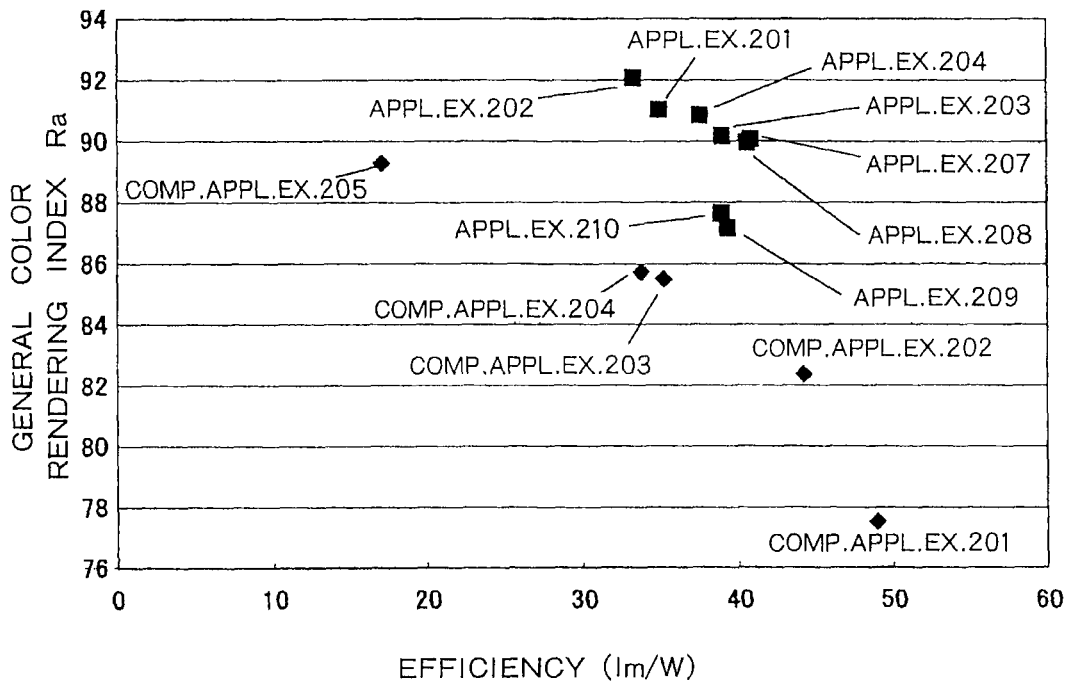
F I G. 41
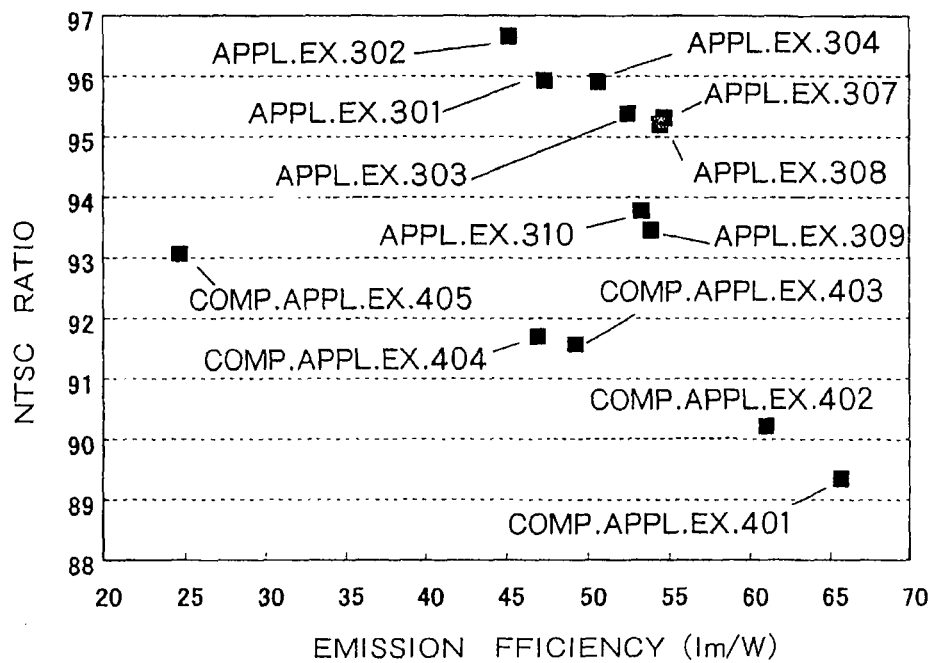
F I G. 42

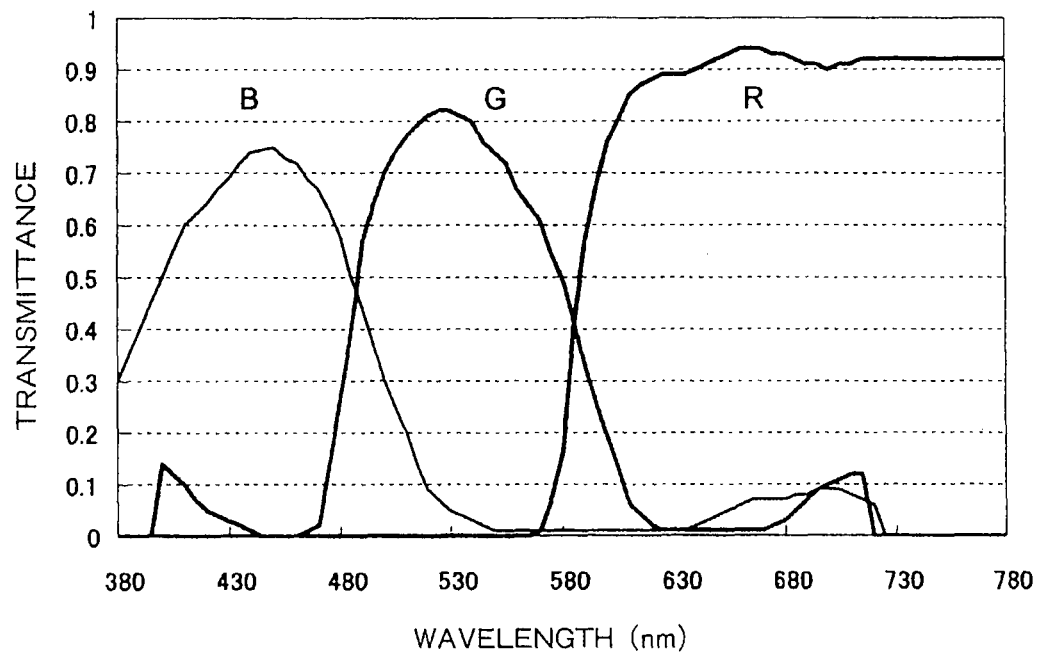
F I G. 43
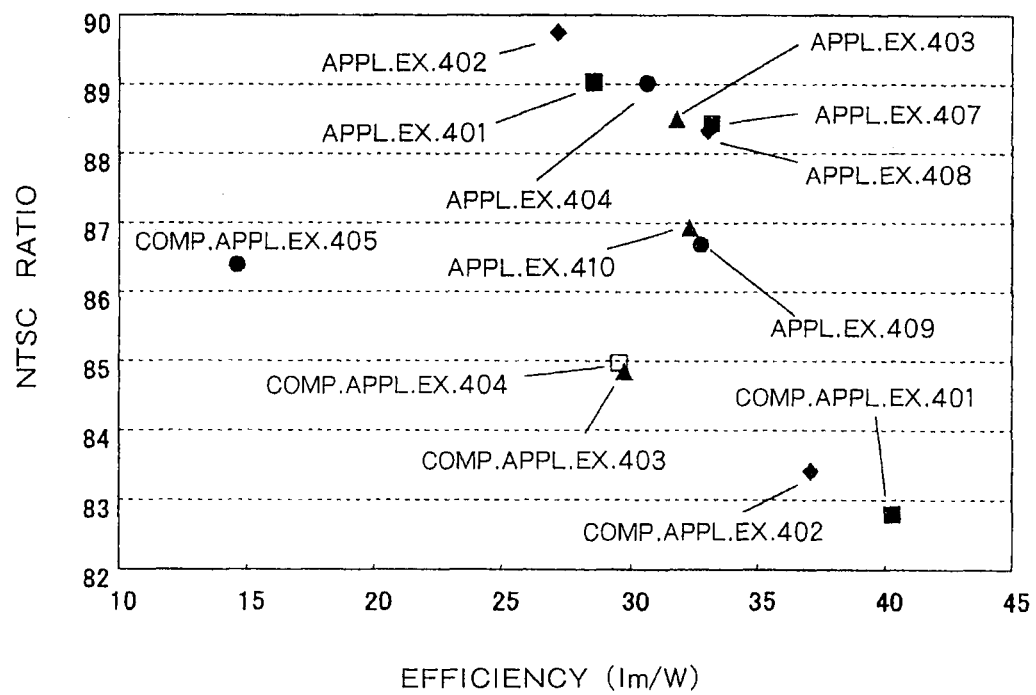
F I G. 44

RED LIGHT-EMITTING FLOURESCENT SUBSTANCE AND LIGHT-EMITTING DEVICE EMPLOYING THE SAME

CROSS-REFERENCE TO RELATED APPLICATIONS

This application is based upon and claims the benefit of priority from the prior Japanese Patent Application Nos. 2010-201710, filed on Sep. 9, 2010 and 2011-184927, filed on Aug. 26, 2011; the entire contents of which are incorporated herein by reference.

FIELD

The embodiments relate to a red light-emitting fluorescent substance and a light-emitting device.

BACKGROUND

There is a recently developed white light-emitting LED device that comprises a blue LED and a yellow phosphor $Y_3Al_5O_{12}:Ce^{3+}$ (YAG) in combination. For the purpose of expanding new markets, this device is studied for use as an illumination light or a backlight source of liquid crystal display. However, since the light emitted by the device is a mixture of blue emission from the blue LED and luminescence from the yellow phosphor, the device gives "pseudo-white" color light, which is lacking in red color. Accordingly, from the viewpoint of color rendition, there is room for improvement. In view of this, a new white light-emitting device is proposed that comprises a red light-emitting fluorescent substance in addition to the blue LED and the YAG phosphor, and the red light-emitting fluorescent substance used therein is being vigorously researched in these days.

Meanwhile, it has been more and more required for the white light-emitting device to be improved in luminance. To meet this requirement, increased electric power is often applied to the device and accordingly the device operating temperature is apt to rise considerably. When the device works at a high temperature, the emission efficiency generally drops that the expected luminance often cannot be obtained and/or that the luminance balance among the fluorescent substances may be lost to cause color discrepancies. Also from this point of view, it is desired to provide a fluorescent substance excellent both in luminance and in temperature characteristics.

Further, according to increased demand for high color rendition, various types of the white light-emitting device have been developed and commercially sold for lighting purposes or the like. The color rendition is often evaluated in terms of the general color rendering index (Ra), and hence it is desired to provide a high color rendering light-emitting device giving a high Ra value. On the other hand, for application to displays, it is desired to provide a white light-emitting LED device having both a wide gamut of reproducible colors (NTSC ratio) and a high efficiency.

BRIEF DESCRIPTION OF THE DRAWINGS

FIG. 1 shows a vertical sectional view schematically illustrating a light-emitting device according to one aspect of the embodiment.

FIG. 2 is an XRD profile of the red fluorescent substance produced in Example 1.

FIG. 3 shows an emission spectrum of the red fluorescent substance produced in Example 1 under excitation with a blue LED.

FIG. 4 shows an emission spectrum of the red fluorescent substance produced in Example 2 under excitation with a blue LED.

FIG. 5 is an XRD profile of the red fluorescent substance produced in Example 3.

FIG. 6 shows an emission spectrum of the red fluorescent substance produced in Example 3 under excitation by light at 365 nm.

FIG. 7 shows an emission spectrum of the red fluorescent substance produced in Example 3 under excitation with a blue LED.

FIG. 8 shows an emission spectrum of the red fluorescent substance produced in Example 4 under excitation by light at 365 nm.

FIG. 9 shows an emission spectrum of the red fluorescent substance produced in Example 4 under excitation with a blue LED.

FIG. 10 shows an emission spectrum of the red fluorescent substance produced in Example 5 under excitation by light at 365 nm.

FIG. 11 shows an emission spectrum of the red fluorescent substance produced in Example 5 under excitation with a blue LED.

FIG. 12 shows an emission spectrum of the red fluorescent substance produced in Example 6 under excitation by light at 365 nm.

FIG. 13 shows an emission spectrum of the red fluorescent substance produced in Example 6 under excitation with a blue LED.

FIG. 14 shows an emission spectrum of the red fluorescent substance produced in Example 7 under excitation by light at 365 nm.

FIG. 15 shows an emission spectrum of the red fluorescent substance produced in Example 7 under excitation with a blue LED.

FIG. 16 shows an emission spectrum of the red fluorescent substance produced in Example 8 under excitation by light at 365 nm.

FIG. 17 shows an emission spectrum of the red fluorescent substance produced in Example 8 under excitation with a blue LED.

FIG. 18 shows an emission spectrum of the red fluorescent substance produced in Example 9 under excitation with a blue LED.

FIG. 19 shows an emission spectrum of the red fluorescent substance produced in Example 10 under excitation with a blue LED.

FIG. 20 is an XRD profile of the red fluorescent substance produced in Example 11.

FIG. 21 shows an emission spectrum of the red fluorescent substance produced in Example 11 under excitation by light at 450 nm.

FIG. 22 is an XRD profile of the red fluorescent substance produced in Example 12.

FIG. 23 shows an emission spectrum of the red fluorescent substance produced in Example 12 under excitation by light at 450 nm.

FIG. 24 is an XRD profile of the red fluorescent substance produced in Example 13.

FIG. 25 shows an emission spectrum of the red fluorescent substance produced in Example 13 under excitation by light at 450 nm.

FIG. 26 is an XRD profile of the red fluorescent substance produced in Example 14.

FIG. 27 shows an emission spectrum of the red fluorescent substance produced in Example 14 under excitation by light at 450 nm.

FIG. 28 is an XRD profile of the red fluorescent substance produced in Example 15.

FIG. 29 shows an emission spectrum of the red fluorescent substance produced in Example 15 under excitation by light at 450 nm.

FIG. 30 is an XRD profile of the red fluorescent substance produced in Example 16.

FIG. 31 shows an emission spectrum of the red fluorescent substance produced in Example 16 under excitation by light at 450 nm.

FIG. 32 is an XRD profile of the red fluorescent substance produced in Example 17.

FIG. 35 shows graphs giving temperature characteristics of the red fluorescent substances produced in Example 6 and Comparative Example 2.

FIG. 36 shows a relation between the emission peak wavelength and the luminance retention rate with regard to each of the red fluorescent substances produced in Examples 3, 6, 11 to 13, 15 to 17 and Comparative Examples 1, 2, 4 and 6.

FIG. 37 shows graphs giving temperature characteristics of the red fluorescent substances produced in Example 3 and Comparative Example 4.

FIGS. 38A and 38B schematically illustrates a light-emitting device module produced in Application Example 101.

FIG. 39 shows a relation between the emission efficiency and the general color rendering index Ra with regard to each of the light-emitting device modules produced in Application Examples 101 to 104, 107 to 110 and Comparative Application Examples 101 to 105.

FIGS. 40A and 40B schematically illustrates a light-emitting device module produced in Application Example 201.

FIG. 41 shows a relation between the emission efficiency and the general color rendering index Ra with regard to each of the light-emitting device modules produced in Application Examples 201 to 204, 207 to 210 and Comparative Application Examples 201 to 205.

FIG. 42 shows a relation between the emission efficiency and the size of gamut of reproducible colors (NTSC ratio) with regard to each of the light-emitting device modules produced in Application Examples 301 to 304, 307 to 310 and Comparative Application Examples 301 to 305.

FIG. 43 shows transmission spectra of the color filters used in the light-emitting device of Application Example 301.

FIG. 44 shows a relation between the emission efficiency and the size of gamut of reproducible colors (NTSC ratio) with regard to each of the light-emitting device modules produced in Application Examples 401 to 404, 407 to 410 and Comparative Application Examples 401 to 405.

DETAILED DESCRIPTION

Figure 33:
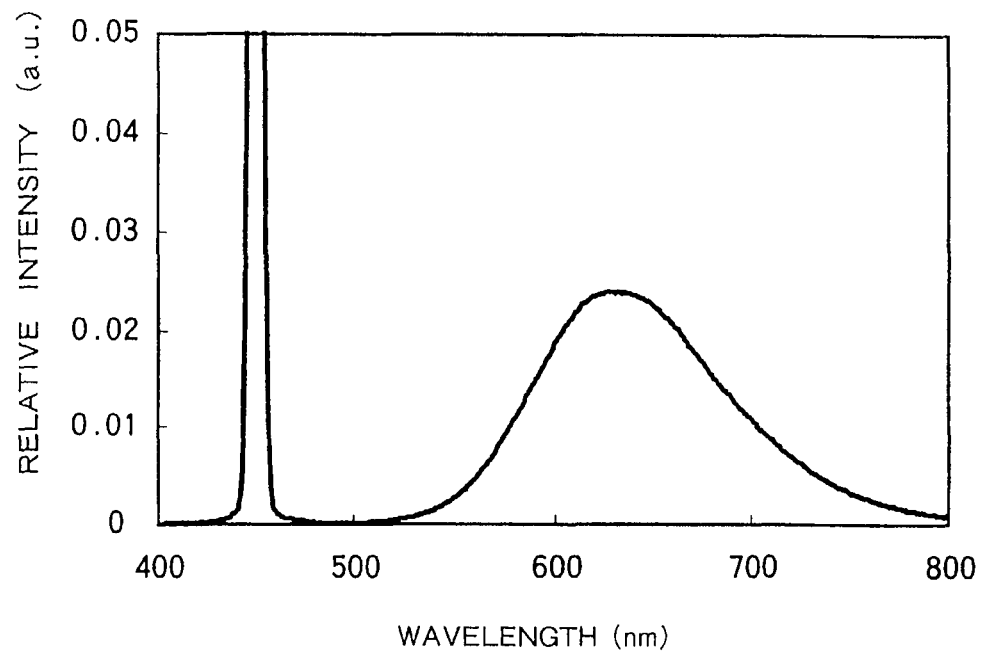
FIG. 33 shows an emission spectrum of the red fluorescent substance produced in Example 17 under excitation by light at 450 nm.

Embodiments will now be explained with reference to the accompanying drawings.

One aspect of the embodiment resides in a red light-emitting fluorescent substance represented by the following formula (1):

$$(M_{1-x}EC_x)_a M^1{}_b AlO_c N_d \tag{1}.$$

In the formula (1), M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\le0.25$ and $4<d<5$, respectively.

This fluorescent substance emits luminescence having a peak in the wavelength range of 620 to 670 nm when excited by light in the wavelength range of 250 to 500 nm.

Red Light-Emitting Fluorescent Substance

The red light-emitting fluorescent substance of the embodiment represented by the formula (1):

$$(M_{1-x}EC_x)_a M^1{}_b AlO_c N_d \tag{1}$$

is generally a kind of SiAlON phosphors.

The fluorescent substance according to the embodiment is characterized by containing oxygen in a very low amount. Oxygen contents of conventional SiAlON phosphors are relatively so large that the oxygen component ratio c in the formula (1) is 0.25 or more. The biggest reason why phosphors having low oxygen contents have not been developed is because no one has recognized that, if the oxygen contents are reduced, emission wavelengths of SiAlON phosphors can be shifted to the longer side without lowering the emission efficiencies, so as to improve color rendition of white LEDs for lighting and to increase NTSC ratios of displays. This advantage of low oxygen content is newly found to realize the present embodiment. Further, in the conventional preparation process, a relatively large amount of $Al_2O_3$ is used as one of the starting materials, and some of them are treated in open atmosphere and hence liable to catch or absorb oxygen in air, and consequently it is very difficult to reduce the oxygen content in the starting materials. Furthermore, it is also difficult to reduce strictly the oxygen and moisture contents in a glove box during the preparation procedure. For these reasons, nobody synthesized the red fluorescent substance having the composition according to the present embodiment.

However, the study of the present inventors has revealed that the red light-emitting fluorescent substance of the formula (1), which contains oxygen in a small amount, has specific characteristics. That is, the red light-emitting fluorescent substance having low oxygen content gives an emission spectrum in which the peak shifts toward the longer wavelength side as compared with known fluorescent substances. The reason of this is presumed as follows. The more oxygen atoms are replaced with nitrogen atoms in the substance matrix, the more the energy level of 4f-orbital is depressed by the action of the nephelauxetic effect and crystal field splitting. That is because nitrogen atoms form stronger covalent bonds than oxygen atoms. As a result, the energy difference between 4f-5d levels decreases and consequently the emission is observed at a longer wavelength. For obtaining this effect, it is necessary for the oxygen component ratio c in the formula (1) to satisfy the condition of $0<c\le0.24$. From the viewpoint of emission wavelength, the oxygen component ratio c is preferably as small as possible. However, in view of easiness in production, the component ratio c is preferably more than 0.05, more preferably more than 0.10, further preferably 0.14 or more. Although the oxygen component ratio c is up to 0.25 in the present embodiment, it is preferably 0.24 or less, more preferably 0.21 or less because the emission wavelength can be further shifted toward the longer side.

The red light-emitting fluorescent substance giving off luminescence in a wavelength region thus shifted toward the longer wavelength side is, for example, combined with a blue LED and a yellow phosphor YAG, so as to improve color rendition remarkably. In fact, the light-emitting device comprising those in combination gives such a large general color rendering index Ra as to realize a white light-emitting LED device having a Ra value as high as not less than 85 or more than 90.

In the formula (1), M is an element selected from the group consisting of IA group elements, IIA group elements, IIIA group elements, IIIB group elements, rare earth elements and IVA group elements.

The metal element M is preferably selected from the group consisting of IA group (alkali metal) elements such as Li, Na and K; IIA group (alkaline earth metal) elements such as Mg, Ca, Sr and Ba; IIIA group elements such as B, In and Ga; IIIB group elements such as Y and Sc; rare earth elements such as Gd, La and Lu; and IVA group elements such as Ge. Most preferably, the metal element M is Sr. The metal element M may be either a single element or two or more elements in combination. Specifically, the metal element M may be a combination of Sr with at least one element selected from the group consisting of Li, Na, K, Mg, Ca, Ba, B, In, Ga, Y, Sc, Gd, La, Lu and Ge. Preferably usable compounds containing the element M are nitrides, carbides and cyanamides.

The metal element EC functions as an emission center of the fluorescent substance. This means that the fluorescent substance of the embodiment has a crystal structure basically constituted of $M^1$, O, N and the above-described element M but that the element M is partly replaced with the emission center element EC. The EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe.

The element $M^1$ is different from the element M and is selected from the group consisting of tetravalent elements. In the SiAlON phosphor of the embodiment, the element $M^1$ is Si or a substituting element thereof. The $M^1$ is selected from tetravalent metal elements, preferably IVA group and IVB group elements such as Si, Ge, Sn, Ti, Zr and Hf. Most preferably, the element $M^1$ is Si. The metal element $M^1$ may be either a single element or two or more elements in combination.

The fluorescent substance according to the embodiment has specific component ratios. In addition to the aforementioned condition of the oxygen component ratio c, it is also necessary for other component ratios to satisfy the following conditions: $0<x<0.2$, $0.55<a<0.80$, $2.10<b<3.90$, $0<c\leq0.25$ and $4<d<5$.

In the fluorescent substance of the embodiment, the component ratio of $M^1$ is limited to such a relatively narrow range as $2.10<b<3.90$. The component ratio of $M^1$ in this range makes it easy to prevent formation of variant phase crystals having various luminescent characteristics. Since having the luminescent characteristics different from those of the aimed fluorescent substance, the variant phase crystals may impair color purity of the luminescence. It is, therefore, preferred to prevent formation of the variant phase crystals. In order to improve the color purity, the component ratio of $M^1$ satisfies the condition of preferably $2.10<b<3.0$, more preferably $2.10<b<2.80$, further preferably $2.10<b<2.70$, furthermore preferably $2.10<b<2.67$ because the variant phase crystals are further prevented from forming. The component ratio of $M^1$ can also satisfy the condition of $2.10<b<2.5$. Further, the fluorescent substance satisfying this condition is also excellent in the emission efficiency.

In the fluorescent substance according to the embodiment, the component ratio x of the emission center, namely, the activation concentration, satisfies the condition of $0<x<0.2$. The activation concentrations in many known fluorescent substances are 0.1 or more, and particularly those in substances emitting luminescence in longer wavelength regions are generally 0.2 or more. This is because fluorescent substances having high activation concentrations are apt to show emission spectra having peaks at wavelengths shifted toward the longer wavelength side. On the other hand, however, their emission efficiencies generally decrease at the same time. Accordingly, it is difficult for them to improve white light-emitting devices in both the color rendition or gamut and the emission efficiency. However, it has been found that, if the oxygen and $M^1$ component ratios are limited as described above according to the embodiment, high color rendition can be realized without increasing the activation concentration of the emission center element. In other words, the red light-emitting fluorescent substance represented by the formula (1) can be made to give an emission spectrum in a longer wavelength region even if the component ratio x is within the range of $0<x<0.2$. Further, the emission efficiency thereof is less lowered. The red fluorescent substance according to the prior art has room for improvement in temperature characteristics (luminance retention rate at a high temperature) if the Eu concentration is increased, but the substance according to the present embodiment can be further improved in the temperature characteristics because the component ratio x satisfies the condition of $0<x<0.2$.

The red fluorescent substance according to the present embodiment may contain a slight amount of carbon as an impurity or a substituting element.

The red light-emitting fluorescent substance of the embodiment is characterized by comprising the above-described compositions, and is further characterized by emitting luminescence having a peak in the wavelength range of 620 to 670 nm under excitation by light in the wavelength range of 250 to 500 nm. In addition, the substance of the embodiment is a kind of SiAlON phosphors but its Eu-activation concentration is restricted to such a low range as $0<x<0.2$, so that its luminance less depends on the temperature.

The fluorescent substance of the present embodiment has a crystal structure belonging to the orthorhombic system. The crystal structure preferably contains a component whose XRD profile measured by use of a specific X-ray of CuKα (wavelength: 1.54056 Å) shows diffraction peaks simultaneously at seven or more positions, preferably nine or more positions selected from the group consisting of eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of diffraction angle (2θ).

Process for Production of Red Light-Emitting Fluorescent Substance

The red light-emitting fluorescent substance of the embodiment can be synthesized from starting materials, such as: nitride, carbide and cyanamide of the element M; nitride, oxide and carbide of the element $M^1$ such as Al and Si; and oxide, nitride and carbonate of the emission center element EC. For example, if the substance containing Sr and Eu as the element M and the emission center element EC, respectively, is to be produced, examples of usable materials include $Sr_3N_2$, AlN, $Si_3N_4$, $Al_2O_3$ and EuN. The material $Sr_3N_2$ can be replaced with $Ca_3N_2$, $Ba_3N_2$, $Sr_2N$, SrN or a mixture thereof. Those powdery materials are weighed out and mixed so that the aimed composition can be obtained, and then the powdery mixture is fired in a crucible to produce the aimed fluorescent substance. In the present embodiment, it is necessary that the oxygen content in the aimed SiAlON phosphor be restricted to a very low level, and hence it is necessary to reduce the amount of oxygen contained in the starting materials. In view of that, it is preferred that the amount of $Al_2O_3$ in the materials be decreased and that of AlN be increased in compensation for the decreased $Al_2O_3$. Further, in the production procedure, it is also necessary to protect as much as possible the stating materials and the firing atmosphere from contamination with impurities such as oxygen or oxygen-containing compounds. For example, it is preferred to reduce oxygen and moisture concentrations in a glove-box where the powdery materials are weighed out and/or mixed. It is also preferred to adopt a favorable production process, for example, to use the materials containing oxygen or oxygen-containing impurities in as small amounts as possible. The materials may be mixed in a mortar placed in the glove-box. The crucible is made of, for example, boron nitride, silicon nitride, silicon carbide, carbon, aluminum nitride, SiAlON, aluminum oxide, molybdenum or tungsten.

The red light-emitting fluorescent substance according to the embodiment can be obtained by firing the mixture of the starting materials for a predetermined time. The firing is preferably carried out under a pressure more than the atmospheric pressure. If silicon nitride is used as one of the materials, the pressure is preferably not less than 5 atmospheres so as to prevent the silicon nitride from decomposing at a high temperature. The firing temperature is preferably in the range of 1500 to 2000° C., more preferably in the range of 1800 to 2000° C. If the temperature is less than 1500° C., it is often difficult to obtain the aimed fluorescent substance. On the other hand, if the temperature is more than 2000° C., there is a fear that the materials or the product may be sublimated. Further, if nitrides are included in the materials, the firing is preferably carried out under $N_2$ atmosphere because they are liable to be oxidized. In that case, $N_2/H_2$ mixed gas atmosphere is also usable. As described above, the oxygen content in the atmosphere should be strictly controlled.

The fired product in the form of powder is then subjected to after-treatment such as washing, if necessary, to obtain a fluorescent substance according to the embodiment. If performed, washing can be carried out with acid or pure water.

Light-Emitting Device

A light-emitting device according to the embodiment comprises the above fluorescent substance and a light-emitting element capable of exciting the fluorescent substance.

The device according to one aspect of the embodiment comprises: a light-emitting element serving as an excitation source; and a combination of the aforementioned red light-emitting fluorescent substance (R) and a yellow light-emitting fluorescent substance (Y) or a green light-emitting fluorescent substance (G) each of which emits luminescence under excitation by light given off from the light-emitting element. Accordingly, the light-emitting device radiates light synthesized with emissions from the light-emitting element and the red and yellow or green fluorescent substances.

The light-emitting device according to another aspect of the embodiment comprises: a light-emitting element serving as an excitation source; and a combination of the above red light-emitting fluorescent substance (R), the above yellow light-emitting fluorescent substance (Y) or green light-emitting fluorescent substance (G), and a blue light-emitting fluorescent substance (B) each of which emits luminescence under excitation by light given off from the light-emitting element.

The light-emitting element such as LED used in the device is properly selected according to the fluorescent substances used together. Specifically, it is necessary that light given off from the light-emitting element be capable of exciting the fluorescent substances. Further, if the device is preferred to radiate white light, the light-emitting element preferably gives off light of such a wavelength that it can complement luminescence emitted from the fluorescent substances.

In view of the above, if the device comprises the red and yellow or green fluorescent substances, the light-emitting element (S1) is generally so selected that it gives off light in the wavelength range of 250 to 500 nm. If the device comprises the red, yellow or green, and blue fluorescent substances, the light-emitting element (S2) is generally so selected that it gives off light of 250 to 430 nm.

The light-emitting device according to the embodiment can be in the form of any conventionally known light-emitting device. FIG. 1 is a vertical sectional view schematically illustrating a light-emitting device of the embodiment.

In the light-emitting device shown in FIG. 1, a resin system 100 comprises leads 101 and 102 molded as parts of a lead frame and also a resin member 103 formed by unified molding together with the lead frame. The resin member 103 gives a concavity 105 in which the top opening is larger than the bottom. On the inside wall of the concavity, a reflective surface 104 is provided.

At the center of the nearly circular bottom of the concavity 105, a light-emitting element 106 is mounted with Ag paste or the like. Examples of the light-emitting element 106 include a light-emitting diode and a laser diode. The light-emitting element is selected so that it can emit light in a proper wavelength according to the fluorescent substances used together in combination. For example, a semiconductor light-emitting element such as GaN can be used as the light-emitting element. The electrodes (not shown) of the light-emitting element 106 are connected to the leads 101 and 102 by way of bonding wires 107 and 108 made of Au or the like, respectively. The positions of the leads 101 and 102 can be adequately modified.

In the concavity 105 of the resin member 103, a phosphor layer 109 is provided. For forming the phosphor layer 109, a mixture 110 containing the fluorescent substance of the embodiment can be dispersed or precipitated in a resin layer 111 made of silicone resin or the like in an amount of 5 to wt %. The fluorescent substance of the embodiment comprises an oxynitride matrix having high covalency, and hence is generally so hydrophobic that it has good compatibility with the resin. Accordingly, scattering at the interface between the resin and the fluorescent substance is prevented enough to improve the light-extraction efficiency.

The light-emitting element 106 may be of a flip chip type in which n-type and p-type electrodes are placed on the same plane. This element can avoid troubles concerning the wires, such as disconnection or dislocation of the wires and light-absorption by the wires. In that case, therefore, a semiconductor light-emitting device excellent both in reliability and in luminance can be obtained. Further, it is also possible to employ an n-type substrate in the light-emitting element 106 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting element 106 and the dimension and shape of the concavity 105 can be properly changed.

The light-emitting device according to the embodiment is not restricted to the package cup-type shown in FIG. 1, and can be freely applied to any type of devices. For example, even if the fluorescent substance according to the embodiment is used in a shell-type or surface-mount type light-emitting device, the same effect can be obtained.

Meanwhile, a light-emitting device module according to the embodiment comprises a plural number of the aforementioned light-emitting devices arranged on a substrate. Any of the above light-emitting devices, which comprise the fluorescent substance of the embodiment, can be freely selected to be used in the module. For example, the shell-type device described above is one of those preferably employed in the module. Specifically, the light-emitting device module comprises a plural number of any of the following light-emitting devices:

(1) a light-emitting device having a laminate structure produced by the steps of: providing, on a substrate, a light-emitting element (S1) giving off light in the wavelength range of 250 to 500 nm; forming thereover a dome with transparent resin; coating the dome with the above red fluorescent substance (R) dispersed in transparent resin; and applying thereon a yellow or green light-emitting fluorescent substance (Y) or (G) dispersed in transparent resin; and (2) a light-emitting device having a laminate structure produced by the steps of: providing, on a substrate, a light-emitting element (S2) giving off light in the wavelength range of 250 to 430 nm; forming thereover a dome with transparent resin; coating the dome with the above red fluorescent substance (R) dispersed in transparent resin; applying thereon a yellow or green fluorescent substance (Y) or (G) dispersed in transparent resin; and further applying thereon a blue light-emitting fluorescent substance (B) dispersed in transparent resin.

There is no particular restriction on materials of the substrate, and hence it can be freely selected from known materials according to the aim. Examples of the materials include glass, silicon, semiconductors and resins. The surface of the substrate may be subjected to various modifications according to necessity. For example, wiring or isolation structures for the light-emitting devices can be laid on the surface. Further, in order to improve heat-dissipating, a heat-sinking layer can be formed thereon. The substrate in itself may be a heat-sinking substrate excellent in thermal conductivity.

The yellow fluorescent substance emits luminescence having a peak in the wavelength range of 540 to 580 nm when excited by light given off from the light-emitting element (S1) or (S2), and is preferably a YAG phosphor. The blue fluorescent substance emits luminescence having a peak in the wavelength range of 400 to 490 nm when excited by light given off from the light-emitting element (S1) or (S2).

The green fluorescent substance emits luminescence having a peak in the wavelength range of 490 to 540 nm when excited by light given off from the light-emitting element (S1) or (S2), and the blue fluorescent substance emits luminescence having a peak in the wavelength range of 400 to 490 nm when excited by light given off from the light-emitting element (S1) or (S2).

The light-emitting devices are regularly or irregularly arranged on the substrate to form a light-emitting device module. Since having excellent temperature characteristics, the fluorescent substance of the embodiment is hardly affected by heat generated in operation. Accordingly, the devices comprising the fluorescent substances can be arranged so densely that the interval among them can be shortened. For example, the aforementioned shell-type devices seem to be circles or ellipses when seen from above, and they can be placed in such an arrangement as satisfies the condition of (d/a)≤5 in which "a" and "d" are the major axis length of the ellipses and the shortest distance among them, respectively. The "major axis length" here means the longest diameter of the horizontal section of each light-emitting device. In other words, if each light-emitting device has a circular or elliptical horizontal section, it means its diameter or its major axis length, respectively. If necessary, the light-emitting devices can have sections in any shapes, such as rectangles, polygons or lines. In that case, the interval among them cannot be uniformly regulated. Even so, however, the interval among them can be shortened enough to enhance the luminance of the whole light-emitting device module. That is because the fluorescent substance of the embodiment is so excellent in temperature characteristics that its luminescence is hardly affected by heat generated by the adjacent light-emitting devices in operation. From the viewpoint of easiness in production, the (d/a) cannot be too small and is generally 1≤(d/a).

It is indispensable to employ the red light-emitting fluorescent substance of the embodiment in a light-emitting device or a light-emitting device module according to the embodiment. However, as for the yellow light-emitting fluorescent substance (Y), the green light-emitting fluorescent substance (G) and the blue light-emitting fluorescent substance (B), there is no particular restriction. The red fluorescent substance (R) of the embodiment has such excellent temperature characteristics that it is hardly affected by temperature change. In order to utilize this advantage to the utmost, both the yellow or green fluorescent substance (Y) or (G) and the blue one (B) are preferably excellent in temperature characteristics, too. If comprising those preferred fluorescent substances, the light-emitting device or module gives off light less changed in color even when the temperature is changed. That is not only because the red fluorescent substance emits luminescence less changed in intensity but also because the other fluorescent substances emit luminescence less changed in intensity, too.

Examples of the preferred blue fluorescent substance excellent in temperature characteristics include $(Ba,Eu)MgAl_{10}O_{17}$, $(Sr,Ca,Ba,Eu)_{10}(PO_4)_6Cl_2$ and $(Sr,Eu)Si_9Al_{19}ON_{31}$.

The embodiment is further explained by the following examples, which by no means restrict the embodiment.

Example 1

As the starting materials, $Sr_3N_2$, $EuN$, $Si_3N_4$ and $AlN$ in the amounts of 2.443 g, 0.465 g, 4.583 g and 1.721 g, respectively, were weighed out and dry-mixed in an agate mortar in a vacuum glove box. The mixture was placed in a BN crucible and then fired at 1850° C. for 4 hours under 7.5 atm of $N_2$ atmosphere, to synthesize a red light-emitting fluorescent substance (R1).

The substance (R1) after firing was in the form of orange powder, and emitted red luminescence when exited with black light. FIGS. 2, 3 and Table 1 show an XRD profile, an emission spectrum under excitation by light at 458 nm, and a result of composition analysis (in terms of molar ratio provided that the Al component is regarded as 1.00), respectively, of the obtained red fluorescent substance. The XRD profile shown in FIG. 2 is an X-ray powder pattern measured by use of a specific X-ray of CuKα (wavelength: 1.54056 Å). The apparatus used for the measurement was M18XHF[22]-SRA type X-ray diffractometer ([trademark], manufactured by MAC Science Co. Ltd.). The measurement conditions were: tube voltage: 40 kV, tube current: 100 mA, and scanning speed: 2°/minute. In the following Examples and Comparison Examples, XRD profiles were measured under the same conditions. In FIG. 3, the band having a peak at 458 nm is attributed to reflection of the excitation light. As a result, the fluorescent substance of Example 1 was found to show an emission spectrum of a single band having a peak at 640 nm.

Example 2

The procedure of Example 1 was repeated except that only the firing atmosphere was changed, to synthesize a red light-emitting fluorescent substance (R2).

The substance (R2) after firing was in the form of orange powder, and emitted red luminescence when exited with black light. FIG. 4 and Table 1 show an emission spectrum under excitation by light at 460 nm and a result of composition analysis (in terms of molar ratio provided that the Al component is regarded as 1.00), respectively, of the obtained red fluorescent substance. In FIG. 4, the band having a peak at 460 nm is attributed to reflection of the excitation light. As a result, the fluorescent substance of Example 2 was found to show an emission spectrum of a single band having a peak at 640 nm.

Example 3

The procedure of Example 1 was repeated except that only the firing time was changed into 2 hours, to synthesize a red light-emitting fluorescent substance (R3).

The substance (R3) after firing was in the form of orange powder, and emitted red luminescence when exited with black light. FIGS. 5, 6, 7 and Table 1 show an XRD profile, emission spectra under excitation by light at 365 nm and 457 nm, and a result of composition analysis (in terms of molar ratio provided that the Al component is regarded as 1.00), respectively, of the obtained red fluorescent substance. In FIG. 7, the band having a peak at 457 nm is attributed to reflection of the excitation light. As a result, the fluorescent substance of Example 3 was found to show an emission spectrum of a single band having a peak at 638 nm.

Example 4

The procedure of Example 3 was repeated except that only the firing atmosphere was changed, to synthesize a red light-emitting fluorescent substance (R4).

The substance (R4) after firing was in the form of orange powder, and emitted red luminescence when exited with black light. FIGS. 8, 9 and Table 1 show emission spectra under excitation by light at 365 nm and 461 nm and a result of composition analysis (in terms of molar ratio provided that the Al component is regarded as 1.00), respectively, of the obtained red fluorescent substance. In FIG. 9, the band having a peak at 461 nm is attributed to reflection of the excitation light. As a result, the fluorescent substance of Example 4 was found to show an emission spectrum of a single band having a peak at 640 nm.

Example 5

As the starting materials, $Sr_3N_2$, EuN, $Si_3N_4$ and AlN in the amounts of 2.660 g, 0.093 g, 4.583 g and 1.721 g, respectively, were weighed out and dry-mixed in an agate mortar in a vacuum glove box. The mixture was placed in a BN crucible and then fired at 1850° C. for 3 hours under 7.5 atm of $N_2$ atmosphere, to synthesize a red light-emitting fluorescent substance (R5).

The substance (R5) after firing was in the form of orange powder, and emitted red luminescence when exited with black light. FIGS. 10, 11 and Table 1 show emission spectra under excitation by light at 365 nm and 457 nm and a result of composition analysis (in terms of molar ratio provided that the Al component is regarded as 1.00), respectively, of the obtained red fluorescent substance. In FIG. 11, the band having a peak at 457 nm is attributed to reflection of the excitation light. As a result, the fluorescent substance of Example 5 was found to show an emission spectrum of a single band having a peak at 620 nm.

Example 6

The procedure of Example 5 was repeated except that only the firing atmosphere was changed, to synthesize a red light-emitting fluorescent substance (R6).

The substance (R6) after firing was in the form of orange powder, and emitted red luminescence when exited with black light. FIGS. 12, 13 and Table 1 show emission spectra under excitation by light at 365 nm and 457 nm and a result of composition analysis (in terms of molar ratio provided that the Al component is regarded as 1.00), respectively, of the obtained red fluorescent substance. In FIG. 13, the band having a peak at 457 nm is attributed to reflection of the excitation light. As a result, the fluorescent substance of Example 6 was found to show an emission spectrum of a single band having a peak at 622 nm.

Example 7

As the starting materials, $Sr_3N_2$, EuN, $Si_3N_4$ and AlN in the amounts of 2.525 g, 0.325 g, 4.583 g and 1.721 g, respectively, were weighed out and dry-mixed in an agate mortar in a vacuum glove box. The mixture was placed in a BN crucible and then fired at 1850° C. for 3 hours under 7.5 atm of $N_2$ atmosphere, to synthesize a red light-emitting fluorescent substance (R7).

The substance (R7) after firing was in the form of orange powder, and emitted red luminescence when exited with black light. FIGS. 14, 15 and Table 1 show emission spectra under excitation by light at 365 nm and 457 nm and a result of composition analysis (in terms of molar ratio provided that the Al component is regarded as 1.00), respectively, of the obtained red fluorescent substance. In FIG. 15, the band having a peak at 457 nm is attributed to reflection of the excitation light. As a result, the fluorescent substance of Example 7 was found to show an emission spectrum of a single band having a peak at 636 nm.

Example 8

The procedure of Example 7 was repeated except that only the firing atmosphere was changed, to synthesize a red light-emitting fluorescent substance (R8).

The substance (R8) after firing was in the form of orange powder, and emitted red luminescence when exited with black light. FIGS. 16, 17 and Table 1 show emission spectra under excitation by light at 365 nm and 457 nm and a result of composition analysis (in terms of molar ratio provided that the Al component is regarded as 1.00), respectively, of the obtained red fluorescent substance. In FIG. 17, the band having a peak at 457 nm is attributed to reflection of the excitation light. As a result, the fluorescent substance of Example 8 was found to show an emission spectrum of a single band having a peak at 635 nm.

Example 9

As the starting materials, $Sr_3N_2$, EuN, $Si_3N_4$, $Al_2O_3$ and AlN in the amounts of 2.321 g, 0.441 g, 5.075 g, 0.119 g and 1.195 g, respectively, were weighed out and dry-mixed in an agate mortar in a vacuum glove box. The mixture was placed in a BN crucible and then fired at 1850° C. for 1 hour under 7.5 atm of $N_2$ atmosphere, to synthesize a red light-emitting fluorescent substance (R9).

The substance (R9) after firing was in the form of orange powder, and emitted red luminescence when exited with black light. FIG. 18 and Table 1 show an emission spectrum under excitation by light at 458 nm and a result of composition analysis (in terms of molar ratio provided that the Al component is regarded as 1.00), respectively, of the obtained red fluorescent substance. In FIG. 18, the band having a peak at 458 nm is attributed to reflection of the excitation light. As a result, the fluorescent substance of Example 9 was found to show an emission spectrum of a single band having a peak at 629 nm.

Example 10

The procedure of Example 9 was repeated except that only the firing atmosphere was changed, to synthesize a red light-emitting fluorescent substance (R10).

The substance (R10) after firing was in the form of orange powder, and emitted red luminescence when exited with black light. FIG. 19 and Table 1 show an emission spectrum under excitation by light at 457 nm and a result of composition analysis (in terms of molar ratio provided that the Al component is regarded as 1.00), respectively, of the obtained red fluorescent substance. In FIG. 19, the band having a peak at 461 nm is attributed to reflection of the excitation light. As a result, the fluorescent substance of Example 10 was found to show an emission spectrum of a single band having a peak at 629 nm.

Example 11

As the starting materials, $Sr_3N_2$, EuN, $Si_3N_4$ and AlN in the amounts of 2.625 g, 0.237 g, 4.911 g and 1.844 g, respectively, were weighed out and dry-mixed in an agate mortar in a vacuum glove box. The mixture was placed in a BN crucible and then fired at 1850° C. for 2 hours under 7.5 atm of $N_2$ atmosphere, to synthesize a red light-emitting fluorescent substance (R11). This red fluorescent substance was in the form of orthorhombic crystals. FIGS. 20 and 21 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 12

As the starting materials, $Sr_3N_2$, EuN, $Si_3N_4$ and AlN in the amounts of 2.653 g, 0.189 g, 4.911 g and 1.844 g, respectively, were weighed out and dry-mixed in an agate mortar in a vacuum glove box. The mixture was placed in a BN crucible and then fired at 1850° C. for 0.5 hour under 7.5 atm of $N_2$ atmosphere, to synthesize a red light-emitting fluorescent substance (R12). This red fluorescent substance was in the form of orthorhombic crystals. FIGS. 22 and 23 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 13

As the starting materials, $Sr_3N_2$, EuN, $Si_3N_4$ and AlN in the amounts of 2.667 g, 0.166 g, 5.086 g and 1.691 g, respectively, were weighed out and dry-mixed in an agate mortar in a vacuum glove box. The mixture was placed in a BN crucible and then fired at 1800° C. for 2 hours under 7.5 atm of $N_2$ atmosphere, to synthesize a red light-emitting fluorescent substance (R13). This red fluorescent substance was in the form of orthorhombic crystals. FIGS. 24 and 25 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 14

As the starting materials, $Sr_3N_2$, EuN, $Si_3N_4$ and AlN in the amounts of 2.526 g, 0.157 g, 4.911 g and 1.844 g, respectively, were weighed out and dry-mixed in an agate mortar in a vacuum glove box. The mixture was placed in a BN crucible and then fired at 1800° C. for 3 hours under 7.5 atm of $N_2$ atmosphere, to synthesize a red light-emitting fluorescent substance (R14). This red fluorescent substance was in the form of orthorhombic crystals. FIGS. 26 and 27 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 15

As the starting materials, $Sr_3N_2$, EuN, $Si_3N_4$ and AlN in the amounts of 2.667 g, 0.166 g, 5.086 g and 1.691 g, respectively, were weighed out and dry-mixed in an agate mortar in a vacuum glove box. The mixture was placed in a BN crucible and then fired at 1800° C. for 1 hour under 7.5 atm of $N_2$ atmosphere, to synthesize a red light-emitting fluorescent substance (R15). This red fluorescent substance was in the form of orthorhombic crystals. FIGS. 28 and 29 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 16

As the starting materials, $Sr_3N_2$, EuN, $Si_3N_4$ and AlN in the amounts of 2.667 g, 0.166 g, 5.262 g and 1.537 g, respectively, were weighed out and dry-mixed in an agate mortar in a vacuum glove box. The mixture was placed in a BN crucible and then fired at 1800° C. for 1.5 hours under 7.5 atm of $N_2$ atmosphere, to synthesize a red light-emitting fluorescent substance (R16). This red fluorescent substance was in the form of orthorhombic crystals. FIGS. 30 and 31 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Example 17

As the starting materials, $Sr_3N_2$, EuN, $Si_3N_4$ and AlN in the amounts of 2.667 g, 0.166 g, 4.991 g and 1.844 g, respectively, were weighed out and dry-mixed in an agate mortar in a vacuum glove box. The mixture was placed in a BN crucible and then fired at 1800° C. for 1.5 hours under 7.5 atm of $N_2$ atmosphere, to synthesize a red light-emitting fluorescent substance (R17). This red fluorescent substance was in the form of orthorhombic crystals. FIGS. 32 and 33 show an XRD profile measured by use of a specific X-ray of CuKα (wavelength: 1.54056 Å) and an emission spectrum under excitation by light at 458 nm (excitation light peak wavelength: 450 mm, half-width: 5.8 nm), respectively.

Any one of the XRD profiles given by the fluorescent substances of Examples 1 to 17 exhibited diffraction peaks simultaneously at eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of diffraction angle (2θ).

Comparative Example 1

Eu 10%

The procedure of Example 1 was repeated except that $Sr_3N_2$, EuN, $Si_3N_4$, $Al_2O_3$ and AlN were used in the amounts of 2.443 g, 0.465 g, 4.583 g, 0.476 g and 1.339 g, respectively, to synthesize a fluorescent substance. The obtained substance was combined with a blue LED and a yellow phosphor YAG to produce a white LED, which was found to have a color temperature of 2800 K and a Ra value of 73.

Comparative Example 2

Eu 20%

The procedure of Example 1 was repeated except that $Sr_3N_2$, EuN, $Si_3N_4$, $Al_2O_3$ and AlN were used in the amounts of 2.172 g, 0.929 g, 4.583 g, 0.476 g and 1.339 g, respectively, to synthesize a fluorescent substance.

Comparative Example 3

Eu 40%

The procedure of Example 1 was repeated except that $Sr_3N_2$, EuN, $Si_3N_4$, $Al_2O_3$ and AlN were used in the amounts of 1.629 g, 1.859 g, 4.583 g, 0.476 g and 1.339 g, respectively, to synthesize a fluorescent substance.

Comparative Example 4

Eu 50%

The procedure of Example 1 was repeated except that $Sr_3N_2$, EuN, $Si_3N_4$, $Al_2O_3$ and AlN were used in the amounts of 1.357 g, 2.324 g, 4.583 g, 0.476 g and 1.339 g, respectively, to synthesize a fluorescent substance.

Comparative Example 5

Eu 80%

The procedure of Example 1 was repeated except that $Sr_3N_2$, EuN, $Si_3N_4$, $Al_2O_3$ and AlN were used in the amounts of 0.543 g, 3.718 g, 4.583 g, 0.476 g and 1.339 g, respectively, to synthesize a fluorescent substance.

Comparative Example 6

Eu 15%

The procedure of Example 1 was repeated except that $Sr_3N_2$, EuN, $Si_3N_4$, $Al_2O_3$ and AlN were used in the amounts of 2.308 g, 0.697 g, 4.583 g, 0.476 g and 1.339 g, respectively, to synthesize a fluorescent substance.

The fluorescent substances of Examples and Comparative Examples were subjected to composition analysis, and the results were as set forth in Table 1. The composition ratios in Table 1 were normalized by regarding the content of Al as 1.00. However, with respect to Examples 11 to 17, the analysis of carbon C was not carried out.

The composition of oxynitride fluorescent substance can be analyzed in any known manner, for example, in the following manner.

The contents of M, $M^1$, Al and EC can be measured by, for example, inductively coupled plasma atomic emission spectroscopic analysis (often referred to as "ICP analysis"). Specifically, the sample of oxynitride fluorescent substance is weighed out in a platinum crucible and then decomposed by alkali fusion. After an internal standard element Y is added, the decomposed sample is dissolved to prepare a sample solution, which is subsequently subjected to ICP analysis. With respect to M, $M^1$ and EC, the analysis can be carried out by means of, for example, an ICP emission spectrometry (SPS-4000 [trademark], manufactured by SII Nano Technology Inc.).

The contents of O and N can be measured, for example, by the inert gas fusion method. Specifically, the sample of oxynitride fluorescent substance is heated to melt in a graphite crucible, and O atoms contained in the sample are converted into CO with inert gas transfer. The CO is further oxidized into $CO_2$, which is then measured by IR absorption spectroscopy to determine the content of O. After the $CO_2$ is removed from the sample, the content of N is measured by the heat conduction method. The measurement can be carried out by means of, for example, an oxygen, nitrogen-hydrogen analyzer (TC-600 [trademark], manufactured by LECO corporation (US)). The content of C was measured by means of a carbon/sulfur analyzer (CS-444LS [trademark], manufactured by LECO corporation (US)) according to high frequency combustion-IR absorption spectroscopy.

TABLE 1

| | Results of composition analysis by ICP (normalized by regarding the content of Al as 1.00) | | | | | | |
|---|---|---|---|---|---|---|---|
| | Sr | Eu | Al | Si | O | N | C |
| Ex. 1 | 0.61 | 0.07 | 1.00 | 2.46 | 0.21 | 4.39 | 0.02 |
| Ex. 2 | 0.64 | 0.07 | 1.00 | 2.63 | 0.21 | 4.72 | 0.02 |
| Ex. 3 | 0.59 | 0.07 | 1.00 | 2.35 | 0.20 | 4.56 | 0.02 |
| Ex. 4 | 0.58 | 0.07 | 1.00 | 2.39 | 0.18 | 4.56 | 0.02 |
| Ex. 5 | 0.63 | 0.01 | 1.00 | 2.42 | 0.17 | 4.56 | 0.02 |
| Ex. 6 | 0.62 | 0.01 | 1.00 | 2.40 | 0.17 | 4.43 | 0.03 |
| Ex. 7 | 0.62 | 0.05 | 1.00 | 2.46 | 0.19 | 4.55 | 0.03 |
| Ex. 8 | 0.60 | 0.05 | 1.00 | 2.41 | 0.17 | 4.43 | 0.02 |
| Ex. 9 | 0.57 | 0.06 | 1.00 | 2.35 | 0.24 | 4.27 | 0.03 |
| Ex. 10 | 0.57 | 0.06 | 1.00 | 2.38 | 0.23 | 4.31 | 0.03 |
| Ex. 11 | 0.59 | 0.03 | 1.00 | 2.36 | 0.16 | 4.48 | — |
| Ex. 12 | 0.59 | 0.03 | 1.00 | 2.33 | 0.17 | 4.48 | — |
| Ex. 13 | 0.66 | 0.02 | 1.00 | 2.64 | 0.16 | 4.86 | — |
| Ex. 14 | 0.57 | 0.02 | 1.00 | 2.32 | 0.16 | 4.41 | — |
| Ex. 15 | 0.66 | 0.03 | 1.00 | 2.60 | 0.19 | 4.86 | — |

TABLE 1-continued

Results of composition analysis by ICP (normalized by regarding the content of Al as 1.00)

| | Sr | Eu | Al | Si | O | N | C |
|---|---|---|---|---|---|---|---|
| Ex. 16 | 0.64 | 0.02 | 1.00 | 2.62 | 0.15 | 4.64 | — |
| Ex. 17 | 0.59 | 0.02 | 1.00 | 2.34 | 0.16 | 4.29 | — |
| Com. 1 | 0.60 | 0.07 | 1.00 | 2.26 | 0.43 | 4.19 | 0.01 |
| Com. 3 | 0.42 | 0.28 | 1.00 | 2.32 | 0.48 | 4.30 | 0.01 |
| Com. 4 | 0.34 | 0.34 | 1.00 | 2.29 | 0.48 | 4.14 | 0.01 |
| Com. 5 | 0.14 | 0.57 | 1.00 | 2.35 | 0.51 | 4.25 | 0.01 |

The substances of Examples contained oxygen in decreased amounts, as compared with those of Comparative Examples. One of the reasons for this is that oxygen contained in the starting materials was reduced in each Example. Specifically, the amount of $Al_2O_3$ in the materials was decreased and that of AlN was increased in compensation for the decreased $Al_2O_3$, and further the starting materials were so selected that they might contain impurities in low amounts.

Another reason is because oxygen and moisture concentrations were reduced in the glove-box, where the materials were weighed out and mixed. Specifically, the materials containing decreased amounts of oxygen were weighed out and mixed in the vacuum glove box in whose atmosphere oxygen was strictly controlled.

In Examples 1 to 8, the materials included no oxide and the firing was carried out in $N_2$ atmosphere, and thereby oxygen was intentionally avoided. Nevertheless, since it was impossible to remove oxygen completely from the materials and the atmosphere, the resultant fluorescent substances still contained oxygen. However, they had such small oxygen contents as had never been realized before. That is because of the production process according to the embodiment. In the production process of the embodiment as contrasted with that of known SiAlON phosphors, the amount of $Al_2O_3$ in the starting materials was decreased and that of AlN was increased in compensation for the decreased $Al_2O_3$, and the starting materials were so purified that they might contain oxygen in low amounts. Further, in prior arts, some of the materials were treated out of a glove box. In contrast, in the process of the embodiment, all the materials were treated in the glove box in whose atmosphere oxygen concentration was strictly controlled to be reduced, so as to obtain a phosphor having such low oxygen content as no one had ever obtained before.

It had been difficult to produce fluorescent substances having high b values. That was because, even if attempts were made to synthesize those phosphors, by-products of the aimed substances in variant phases were formed in large amounts to obtain green light-emitting fluorescent substances, such as $Sr_3Al_3Si_{13}O_2N_{21}$:Eu, whose component ratios were different from those of the aimed phosphors. However, it has been found that formation of the substances in variant phases can be avoided by controlling the synthesis conditions. For example, if moisture and oxygen contents in the production atmosphere are kept at low levels, the red light-emitting fluorescent substance of the present embodiment can be produced in a good yield. Specifically, the moisture and oxygen concentrations in the production atmosphere can be reduced by means of a gas-circular purification equipment installed in a glove box, and thereby it becomes possible to produce a red light-emitting fluorescent substance having a composition that no one has ever realized before.

The value of b is regulated to be less than 3.90 in the present embodiment, but is preferably less than 3.0, more preferably less than 2.8, further preferably less than 2.7, furthermore preferably less than 2.67, so as to prevent formation of variant phase crystals and hence to produce a fluorescent substance having good characteristics.

With respect to the red fluorescent substances of Examples and Comparative Examples, Table 2 shows their chromaticity coordinates (x, y) in the CIE1931 chromaticity diagram.

TABLE 2

| | chromaticity coordinate (CIE1931) | |
|---|---|---|
| | Cx | Cy |
| Ex. 1 | 0.590 | 0.358 |
| Ex. 2 | 0.586 | 0.349 |
| Ex. 3 | 0.608 | 0.375 |
| Ex. 4 | 0.610 | 0.372 |
| Ex. 5 | 0.544 | 0.420 |
| Ex. 6 | 0.546 | 0.419 |
| Ex. 7 | 0.591 | 0.368 |
| Ex. 8 | 0.591 | 0.370 |
| Ex. 9 | 0.560 | 0.374 |
| Ex. 10 | 0.555 | 0.368 |
| Ex. 11 | 0.631 | 0.368 |
| Ex. 12 | 0.622 | 0.376 |
| Ex. 13 | 0.619 | 0.380 |
| Ex. 14 | 0.617 | 0.381 |
| Ex. 15 | 0.609 | 0.389 |
| Ex. 16 | 0.617 | 0.381 |
| Ex. 17 | 0.615 | 0.383 |
| Com. 1 | 0.512 | 0.431 |
| Com. 2 | 0.538 | 0.417 |
| Com. 3 | 0.565 | 0.404 |
| Com. 4 | 0.565 | 0.406 |
| Com. 5 | 0.558 | 0.396 |
| Com. 7 | 0.540 | 0.440 |
| Com. 8 | 0.510 | 0.420 |

Evaluation of Emission Efficiency

With respect to the fluorescent substance of each Example and Comparative Example, Table 3 shows the emission peak wavelength (nm) and the emission efficiency (in terms of relative value provided that the efficiency in Comparative Example 1 is regarded as 1).

TABLE 3

| | Peak wavelength (nm) | Emission efficiency (relative value) |
|---|---|---|
| Ex. 1 | 638 | 0.74 |
| Ex. 2 | 640 | 0.71 |
| Ex. 3 | 638 | 0.84 |
| Ex. 4 | 640 | 0.81 |
| Ex. 5 | 620 | 0.79 |
| Ex. 6 | 622 | 0.78 |
| Ex. 7 | 637 | 0.90 |
| Ex. 8 | 635 | 0.86 |
| Ex. 9 | 629 | 0.79 |
| Ex. 10 | 629 | 0.78 |
| Ex. 11 | 641 | 1.09 |
| Ex. 12 | 636 | 1.12 |
| Ex. 13 | 634 | 1.21 |
| Ex. 14 | 632 | 1.20 |
| Ex. 15 | 630 | 1.22 |
| Ex. 16 | 634 | 1.24 |
| Ex. 17 | 632 | 1.16 |
| Com. 1 | 610 | 1.00 |
| Com. 2 | 617 | 0.90 |
| Com. 3 | 623 | 0.67 |
| Com. 4 | 626 | 0.62 |
| Com. 5 | 635 | 0.29 |

Figure 34:
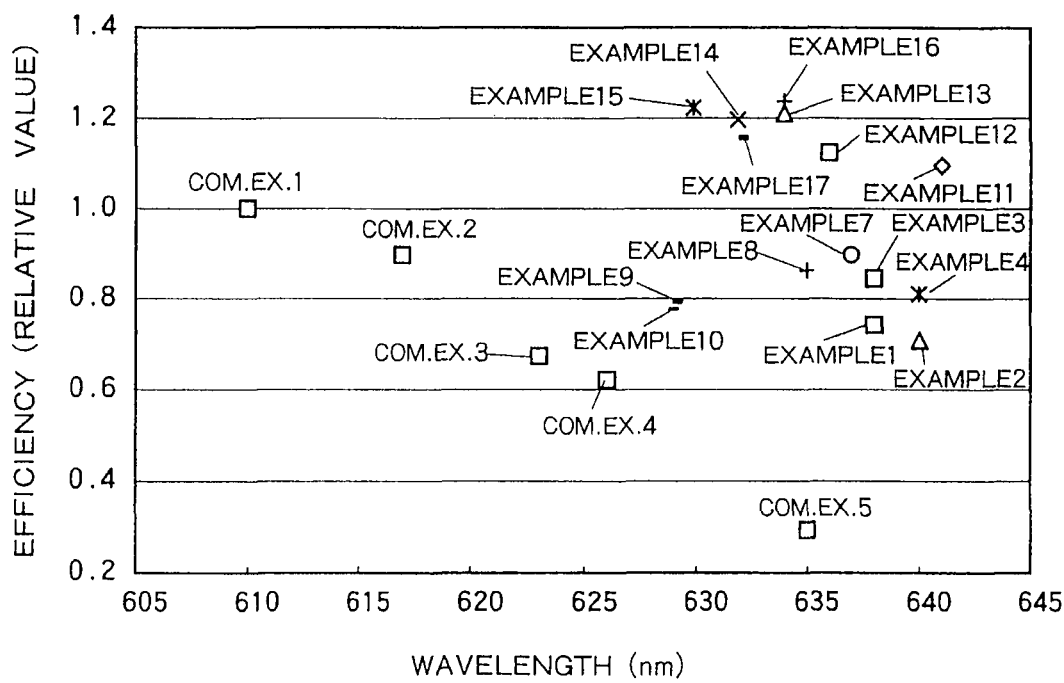
FIG. 34 shows a relation between the emission efficiency and the emission wavelength with regard to each of the red fluorescent substances produced in Examples 1 to 4, 7 to 17 and Comparative Examples 1 to 5.

FIG. 34 shows a relation between the emission efficiency and the emission peak wavelength with regard to each of the fluorescent substances produced in Examples 1 to 4, 7 to 18 and Comparative Examples 1 to 5. In FIG. 34, the emission efficiency is plotted on the vertical axis in terms of relative value provided that the efficiency of the substance produced in Comparative Example 1 is regarded as 1.0. FIG. 34 indicates that the emission efficiencies of Comparative Examples decrease according as the emission peak wavelengths become longer. On the other hand, as compared with Comparative Examples, the substances of Examples have high efficiencies even if their emission peaks are located at longer wavelengths. The substances of Comparative Examples contain Eu in relatively high concentrations, and thereby they emit luminescence in longer wavelength regions. However, if Eu is contained in a high concentration, the energy is more likely to be transferred among the Eu atoms to lower the emission efficiency (i.e., concentration quenching). In contrast, the Eu concentration in the fluorescent substance of the embodiment is kept low but the oxygen/nitrogen ratio is reduced so as to shift the emission wavelength toward the longer wavelength side. Accordingly, even if emitting luminescence in a longer wavelength region, the substance according to the embodiment does not undergo the concentration quenching and hence can keep high emission efficiency. Thus, the oxygen contents were reduced as compared with known fluorescent substances, and thereby it succeeded to obtain fluorescent substances that emit luminescence in longer wavelength regions with high efficiencies.

Evaluation of Temperature Characteristics

The red powdery substances of Example 6 and Comparative Example 2 were excited while they were being heated with a heater from room temperature to 200° C., to measure the change of the emission spectra. The light source used for excitation was a LED giving off light having a peak at 458 nm. The results were shown in FIG. 35, which indicates temperature dependence of the peak intensities in the emission spectra. The relative intensity plotted on the y-axis in FIG. 35 was normalized under the condition that the emission intensity of each fluorescent substance at room temperature was regarded as 1.00.

FIG. 35 indicates that the red fluorescent substance of Example 6 has larger luminance retention rates at high temperatures than that of Comparative Example 2, which has relatively good temperature characteristics.

FIG. 36 shows a relation between the emission peak wavelength and the luminance retention rate at 150° C. with regard to each of the red fluorescent substances produced in Examples 3, 6, 11 to 18 and Comparative Examples 1, 2, 4 and 6. The luminance retention rate at 150° C. here means a relative emission intensity at 150° C. under the condition that the emission intensity at room temperature is regarded as 1.00. As shown in FIG. 36, the luminance retention rates of Comparative Examples at a high temperature decrease according as the emission peak wavelengths become longer. On the other hand, however, the substances according to the embodiment keep higher luminance retention rates than those of Comparative Examples at the same emission peak wavelengths. Further, it should be noted that the substances of Example 6 and Comparative Example 2 show emission peaks at 622 nm and 617 nm, respectively. That is, although the substance of Example 6 has a longer emission peak wavelength than that of Comparative Example 2, the former keeps a higher luminance retention rate than the latter.

FIG. 37 shows graphs giving temperature characteristics of the red fluorescent substances produced in Example 3 and Comparative Example 4. In prior arts, known fluorescent substances are liable to have lower luminance retention rates at high temperatures according as the emission wavelengths become longer. However, as shown in FIG. 37, the substance of the embodiment produced in Example 3 has a longer emission wavelength but better temperature characteristics than the substance of Comparative Example 4.

The present embodiment thus enables to produce a fluorescent substance giving luminescence in a longer wavelength region but having larger luminance retention rates at high temperatures. Since often used at high temperatures, a white light-emitting LED device is required to give emission intensity strong enough to ensure high emission efficiency at high temperatures. Further, the white LED device is also wanted to keep luminance retention rates large enough to prevent the white LED from color discrepancies at high temperatures. From those viewpoints, the red fluorescent substance of the embodiment is suitable for a white light-emitting LED device.

Application to Device Illumination

Application Examples 101 to 104, 107 to 110 and Comparative Application Examples 101 to 105

Under Excitation with a Blue Light-Emitting Diode

A light-emitting device module of Application Example 101 was produced by use of the fluorescent substance synthesized in Example 1. FIG. 38A is a conceptual sketch showing the light-emitting device module of Application Example 101. This module comprised a heat-sinking substrate 2502 and plural shell-type light-emitting devices 2500 arranged thereon. Each shell-type light-emitting device had a structure shown in FIG. 38B. The light-emitting device module was produced in the following manner. First, sixteen LEDs 2501 emitting light having a peak at 455 nm were prepared, and they were placed and soldered on the heat-sinking substrate 2502 in such an arrangement that the center-to-center interval among them might be 6 mm. Subsequently, each LED soldered on the substrate was connected to electrodes by way of gold wires 2503. Each LED was then domed with transparent resin 2504, and the dome was coated with a layer of transparent resin 2505 containing the red fluorescent substance of Example 1. Further, another layer of transparent resin 2506 and still another layer of transparent resin 2507 containing a yellow fluorescent substance emitting luminescence having a peak at 565 nm were stacked thereon in order, to produce a light-emitting device module. Each device seemed to be a circle when seen from above, and its diameter was 2.8 mm.

The procedure of Application Example 101 was repeated except for using each of the fluorescent substances synthesized in Examples 2 to 4, 7 to 10 and Comparative Examples 1 to 5, to produce each light-emitting device module of Application Examples 102 to 104, 107 to 110 and Comparative Application Examples 101 to 105.

As for each module of Application Examples 101 to 104, 107 to 110 and Comparative Application Examples 101 to 105, Table 4 and FIG. 39 show the emission efficiency (lm/W) and the general color rendering index Ra, respectively.

TABLE 4

| | general color rendering index: Ra | Emission efficiency (lm/W) |
|---|---|---|
| Ap. Ex. 101 | 90.1 | 55 |
| Ap. Ex. 102 | 91.1 | 52 |
| Ap. Ex. 103 | 89.2 | 61 |
| Ap. Ex. 104 | 89.9 | 59 |
| Ap. Ex. 107 | 89.1 | 64 |
| Ap. Ex. 108 | 89.0 | 63 |
| Ap. Ex. 109 | 86.6 | 61 |

TABLE 4-continued

|  | general color rendering index: Ra | Emission efficiency (lm/W) |
|---|---|---|
| Ap. Ex. 110 | 86.7 | 61 |
| Com. Ap. 101 | 75.6 | 70 |
| Com. Ap. 102 | 81.5 | 65 |
| Com. Ap. 103 | 84.6 | 52 |
| Com. Ap. 104 | 84.8 | 50 |
| Com. Ap. 105 | 88.4 | 26 |

The above results indicate that it was difficult for the modules of Comparative Application Examples 101 to 105, which adopted conventional fluorescent substances, to realize both high emission efficiencies and high color rendition. On the other hand, however, the results also indicate that the modules of Application Examples 101 to 104 and 107 to 110 according to the embodiment realized both high emission efficiencies and high color rendition, as compared with those of Comparative Application Examples.

Application Examples 201 to 204, 207 to 210 and Comparative Application Examples 201 to 205

Under Excitation with a UV Light-Emitting Diode

A light-emitting device module of Application Example 201 was produced by use of the fluorescent substance synthesized in Example 1. FIG. 40A is a conceptual sketch showing the light-emitting device module of Application Example 201. This module comprised a heat-sinking substrate 2702 and plural shell-type light-emitting devices 2700 arranged thereon. Each shell-type light-emitting device had a structure shown in FIG. 40B. The light-emitting device module was produced in the following manner. First, sixteen LEDs 2701 emitting light having a peak at 390 nm were prepared, and they were placed and soldered on the heat-sinking substrate 2702 in such an arrangement that the center-to-center interval among them might be 6 mm. Subsequently, each LED soldered on the substrate was connected to electrodes by way of gold wires 2703. Each LED was then domed with transparent resin 2704, and the dome was coated with a layer of transparent resin 2705 containing the red fluorescent substance of Example 1. Further, another layer of transparent resin 2706, still another layer of transparent resin 2707 containing a yellow fluorescent substance emitting luminescence having a peak at 565 nm, yet another layer of transparent resin 2708 and still yet another layer of transparent resin 2709 containing a blue fluorescent substance emitting luminescence having a peak at 452 nm were stacked thereon in order, to produce a light-emitting device. Each device seemed to be a circle when seen from above, and its diameter was 3.0 mm.

The procedure of Application Example 101 was repeated except for using each of the fluorescent substances synthesized in Examples 2 to 4, 7 to 10 and Comparative Examples 1 to 5, to produce each light-emitting device module of Application Examples 202 to 204, 207 to 210 and Comparative Application Examples 201 to 205.

As for each module of Application Examples 201 to 204, 207 to 210 and Comparative Application Examples 201 to 205, Table 5 and FIG. 41 show the emission efficiency (lm/W) and the general color rendering index Ra, respectively.

TABLE 5

|  | general color rendering index: Ra | Emission efficiency (lm/W) |
|---|---|---|
| Ap. Ex. 201 | 91.0 | 35 |
| Ap. Ex. 202 | 92.1 | 33 |
| Ap. Ex. 203 | 90.2 | 39 |
| Ap. Ex. 204 | 90.8 | 38 |
| Ap. Ex. 207 | 90.1 | 41 |
| Ap. Ex. 208 | 89.9 | 41 |
| Ap. Ex. 209 | 87.2 | 39 |
| Ap. Ex. 210 | 87.6 | 39 |
| Com. Ap. 201 | 77.5 | 49 |
| Com. Ap. 202 | 82.4 | 44 |
| Com. Ap. 203 | 85.5 | 35 |
| Com. Ap. 204 | 85.7 | 34 |
| Com. Ap. 205 | 89.3 | 17 |

The above results indicate that it was difficult for the modules of Comparative Application Examples 201 to 205, which adopted conventional fluorescent substances, to realize both high emission efficiencies and high color rendition. On the other hand, however, the results also indicate that the modules of Application Examples 201 to 204 and 207 to 210 according to the embodiment realized both high emission efficiencies and high color rendition, as compared with those of Comparative Application Examples.

Application to Backlight

Application Examples 301 to 304, 307 to 310 and Comparative Application Examples 301 to 305

Under Excitation with a Blue Light-Emitting Diode

A light-emitting device module of Application Example 301 was produced by use of the fluorescent substance synthesized in Example 1. The procedure of Application Example 101 was repeated except that the fluorescent substance contained in the transparent resin layer 2507 was changed into the green one emitting luminescence having a peak at 520 nm, to produce the module of Application Example 301.

The procedure of Application Example 301 was repeated except for using each of the fluorescent substances synthesized in Examples 2 to 4, 7 to 10 and Comparative Examples 1 to 5, to produce each light-emitting device module of Application Examples 302 to 304, 307 to 310 and Comparative Application Examples 301 to 305.

As for each module of Application Examples 301 to 304, 307 to 310 and Comparative Application Examples 301 to 305, Table 6 and FIG. 42 show the emission efficiency and the NTSC ratio (i.e., value in the u'–v' chromaticity coordinate system on the CIE1976 chromaticity diagram) measured through a diffuser and color filters, whose transmission spectra are shown in FIG. 43.

TABLE 6

|  | Emission efficiency (lm/W) | NTSC ratio (%) |
|---|---|---|
| Ap. Ex. 301 | 47.4 | 95.9 |
| Ap. Ex. 302 | 45.2 | 96.7 |
| Ap. Ex. 303 | 52.5 | 95.4 |
| Ap. Ex. 304 | 50.7 | 95.9 |
| Ap. Ex. 307 | 54.7 | 95.3 |
| Ap. Ex. 308 | 54.5 | 95.2 |
| Ap. Ex. 309 | 54.1 | 93.5 |
| Ap. Ex. 310 | 53.3 | 93.8 |

TABLE 6-continued

|  | Emission efficiency (lm/W) | NTSC ratio (%) |
| --- | --- | --- |
| Com. Ap. 301 | 65.7 | 89.3 |
| Com. Ap. 302 | 61.0 | 90.2 |
| Com. Ap. 303 | 49.3 | 91.6 |
| Com. Ap. 304 | 47.0 | 91.7 |
| Com. Ap. 305 | 24.7 | 93.1 |

The above results indicate that it was difficult for the modules of Comparative Application Examples 301 to 305, which adopted conventional fluorescent substances, to realize both high emission efficiencies and large NTSC ratios. On the other hand, however, the results also indicate that the modules of Application Examples 301 to 304 and 307 to 310 according to the embodiment realized both high emission efficiencies and large NTSC ratios, as compared with those of Comparative Application Examples.

Application Examples 401 to 404, 407 to 410 and Comparative Application Examples 401 to 405

Under Excitation with a UV Light-Emitting LED Element

A light-emitting device module of Application Example 401 was produced by use of the fluorescent substance synthesized in Example 1. The procedure of Application Example 201 was repeated except that the fluorescent substance contained in the transparent resin layer 2707 was changed into the green one emitting luminescence having a peak at 520 nm, to produce the module of Application Example 401.

The procedure of Application Example 401 was repeated except for using each of the fluorescent substances synthesized in Examples 2 to 4, 7 to 10 and Comparative Examples 1 to 5, to produce each light-emitting device module of Application Examples 402 to 404, 407 to 410 and Comparative Application Examples 401 to 405.

As for each module of Application Examples 401 to 404, 407 to 410 and Comparative Application Examples 401 to 405, Table 7 and FIG. 44 show the emission efficiency and the NTSC ratio (i.e., value in the u'-v' chromaticity coordinate system on the CIE1976 chromaticity diagram) measured through a diffuser and color filters, whose transmission spectra are shown in FIG. 43.

TABLE 7

|  | Emission efficiency (lm/W) | NTSC ratio (%) |
| --- | --- | --- |
| Ap. Ex. 401 | 28.6 | 89.0 |
| Ap. Ex. 402 | 27.2 | 89.7 |
| Ap. Ex. 403 | 31.8 | 88.5 |
| Ap. Ex. 404 | 30.6 | 89.0 |
| Ap. Ex. 407 | 33.2 | 88.4 |
| Ap. Ex. 408 | 33.0 | 88.3 |
| Ap. Ex. 409 | 32.8 | 86.7 |
| Ap. Ex. 410 | 32.3 | 86.9 |
| Com. Ap. 401 | 40.3 | 82.8 |
| Com. Ap. 402 | 37.1 | 83.4 |
| Com. Ap. 403 | 29.7 | 84.8 |
| Com. Ap. 404 | 29.6 | 85.0 |
| Com. Ap. 405 | 14.6 | 86.4 |

The above results indicate that it was difficult for the modules of Comparative Application Examples 401 to 405, which adopted conventional fluorescent substances, to realize both high emission efficiencies and large NTSC ratios. On the other hand, however, the results also indicate that the modules of Application Examples 401 to 404 and 407 to 410 according to the embodiment realized both high emission efficiencies and large NTSC ratios, as compared with those of Comparative Application Examples. Further, the modules employing the fluorescent substances produced in other Examples also exhibited high performances.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A light emitting device comprising:
a fluorescent substance (R) represented by the following formula (1):

$$(M_{1-x}EC_x)_a M^1_b AlO_c N_d \qquad (1),$$

wherein
M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\leq0.25$ and $4<d<5$, respectively; and
the fluorescent substance (R) emits luminescence having a peak in the wavelength range of 620 to 670 nm under excitation by light in the wavelength range of 250 to 500 nm, and
a light-emitting element to excite said fluorescent substance, wherein
said light-emitting element is a light-emitting element giving off light in the wavelength range of 250 to 500 nm, and
another fluorescent substance (Y) is further incorporated that emits luminescence having a peak in the wavelength range of 540 to 580 nm under excitation by light of said light-emitting element (S1).

2. The device according to claim 1, wherein said $M^1$ in the formula (1) is Si.

3. The device according to claim 1, wherein said M in the formula (1) is an element selected from the group consisting of Li, Na, K, Mg, Ca, Sr, Ba, B, In, Ga, Y, Sc, Gd, La, Lu and Ge.

4. The device according to claim 1, wherein said b in the formula (1) is a number satisfying the condition of $2.1<b<2.5$.

5. The device according to claim 1, wherein said c in the formula (1) is a number satisfying the condition of $0.05<c\leq0.21$.

6. The device according to claim 1, wherein the fluorescent substance has a crystal structure belonging to the orthorhombic system.

7. The device according to claim 1, wherein the fluorescent substance contains a component whose XRD profile measured by use of a specific X-ray of CuKα shows diffraction peaks simultaneously at seven or more positions selected from the group consisting of eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of diffraction angle (2θ).

8. The device according to claim 1, wherein said fluorescent substance (Y) is $Y_3Al_5O_{12}:Ce^{3+}$.

9. A light emitting device comprising:
a fluorescent substance (R) represented by the following formula (1):

$$(M_{1-x}EC_x)_a M^1{}_b AlO_c N_d \qquad (1),$$

wherein
M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\le0.25$ and $4<d<5$, respectively; and
the fluorescent substance (R) emits luminescence having a peak in the wavelength range of 620 to 670 nm under excitation by light in the wavelength range of 250 to 500 nm, and
a light-emitting element to excite said fluorescent substance, wherein
said light-emitting element is a light-emitting element (S2) giving off light in the wavelength range of 250 to 430 nm,
another fluorescent substance (Y) is further incorporated that emits luminescence having a peak in the wavelength range of 540 to 580 nm under excitation by light of said light-emitting element (S2), and
still another fluorescent substance (B) is furthermore incorporated that emits luminescence having a peak in the wavelength range of 400 to 490 nm under excitation by light of said light-emitting element (S2).

10. The device according to claim 9, wherein said fluorescent substance (Y) is $Y_3Al_5O_{12}:Ce^{3+}$.

11. The device according to claim 9, wherein said fluorescent substance (B) is selected from the group consisting of $(Ba,Eu)MgAl_{10}O_{17}$, $(Sr,Ca,Ba,Eu)_{10}(PO_4)_6Cl_2$ and $(Sr,Eu)Si_9Al_{19}ON_{31}$.

12. A light emitting device comprising:
a fluorescent substance (R) represented by the following formula (1):

$$(M_{1-x}EC_x)_a M^1{}_b AlO_c N_d \qquad (1),$$

wherein
M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\le0.25$ and $4<d<5$, respectively; and
the fluorescent substance (R) emits luminescence having a peak in the wavelength range of 620 to 670 nm under excitation by light in the wavelength range of 250 to 500 nm, and
a light-emitting element to excite said fluorescent substance, wherein
said light-emitting element is a light-emitting element (S2) giving off light in the wavelength range of 250 to 430 nm,
another fluorescent substance (G) is further incorporated that emits luminescence having a peak in the wavelength range of 490 to 540 nm under excitation by light of said light-emitting element (S2), and
still another fluorescent substance (B) is furthermore incorporated that emit luminescence having a peak in the wavelength range of 400 to 490 nm under excitation by light of said light-emitting element (S2).

13. The device according to claim 12, wherein said fluorescent substance (B) is selected from the group consisting of $(Ba,Eu)MgAl_{10}O_{17}$, $(Sr,Ca,Ba,Eu)_{10}(PO_4)_6Cl_2$ and $(Sr,Eu)Si_9Al_{19}ON_{31}$.

14. A light-emitting device module comprising a plural number of the devices according to claim 1 and a substrate on which said plural devices are placed.

15. A module comprising plural devices and a substrate on which said devices are placed, each of the devices comprising:
a fluorescent substance (R) represented by the following formula (1):

$$(M_{1-x}EC_x)_a M^1{}_b AlO_c N_d \qquad (1),$$

wherein
M is an element selected from the group consisting of IA group elements, IIA group elements, IIIA group elements, IIIB group elements, rare earth elements and IVA group elements; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Ti, Pb, Bi and Fe; $M^1$ is different from M and is selected from the group consisting of tetravalent elements; and x, a, b, c and d are numbers satisfying the conditions of $0<x<0.2$, $0.55<a<0.80$, $2.10<b<3.90$, $0<c\le0.25$ and $4<d<5$, respectively; and
the fluorescent substance (R) emits luminescence having a peak in the wavelength range of 620 to 670 nm under excitation by light in the wavelength range of 250 to 500 nm, and
a light-emitting element to excite said fluorescent substance, wherein
$1\le(d/a)\le5$ is satisfied, where a is a longitudinal length of each of said devices and d is a shortest interval between neighboring two of said devices.

* * * * *